(12) United States Patent
Kabagambe et al.

(10) Patent No.: US 9,758,426 B2
(45) Date of Patent: Sep. 12, 2017

(54) REFLECTIVE ARTICLE HAVING A SACRIFICIAL CATHODIC LAYER

(75) Inventors: Benjamin Kabagambe, Allison Park, PA (US); Michael J. Buchanan, Cranberry Township, PA (US); Matthew S. Scott, Pittsburgh, PA (US); Brian K. Rearick, Allison Park, PA (US); Paul A. Medwick, Allison Park, PA (US); James W. McCamy, Export, PA (US)

(73) Assignee: Vitro, S.A.B. de C.V., Nuevo León (MX)

( * ) Notice: Subject to any disclaimer, the term of this patent is extended or adjusted under 35 U.S.C. 154(b) by 1427 days.

(21) Appl. No.: 13/171,509

(22) Filed: Jun. 29, 2011

(65) Prior Publication Data

US 2013/0003206 A1  Jan. 3, 2013

(51) Int. Cl.
*G02B 5/08* (2006.01)
*C03C 17/38* (2006.01)
*C03C 17/42* (2006.01)
*H01L 31/054* (2014.01)

(52) U.S. Cl.
CPC .............. *C03C 17/38* (2013.01); *C03C 17/42* (2013.01); *G02B 5/0808* (2013.01); *H01L 31/0547* (2014.12); *C03C 2217/445* (2013.01); *C03C 2217/465* (2013.01); *C03C 2217/479* (2013.01); *Y02E 10/52* (2013.01)

(58) Field of Classification Search
CPC ........ G02B 1/105; G02B 1/18; G02B 5/0808; C03C 17/28; C03C 17/42
USPC ................................................. 359/883, 884
See application file for complete search history.

(56) References Cited

U.S. PATENT DOCUMENTS

| 2,680,108 | A | 6/1954 | Schmidt |
| 3,455,806 | A | 7/1969 | Spoor et al. |
| 3,928,157 | A | 12/1975 | Suematsu et al. |
| 3,947,338 | A | 3/1976 | Jerabek et al. |
| 3,959,106 | A | 5/1976 | Bosso et al. |

(Continued)

FOREIGN PATENT DOCUMENTS

| EP | 0632294 A1 | 1/1995 |
| WO | 2011037061 A1 | 3/2011 |

OTHER PUBLICATIONS

PCT Search Report PCT/US2012/033996, filed Apr. 18, 2012, mailed Jun. 28, 2012.

*Primary Examiner* — Ricky D Shafer
(74) *Attorney, Agent, or Firm* — Andrew C. Siminerio

(57) ABSTRACT

The present invention relates to reflective articles, such as solar mirrors, that include a sacrificial cathodic layer. The reflective article, more particularly includes a substrate, such as glass, having a multi-layered coating thereon that includes a lead-free sacrificial cathodic layer. The sacrificial cathodic layer includes at least one transition metal, such as a particulate transition metal, which can be in the form of flakes (e.g., zinc flakes). The sacrificial cathodic layer can include an inorganic matrix formed from one or more organo-titanates. Alternatively, the sacrificial cathodic layer can include an organic polymer matrix (e.g., a crosslinked organic polymer matrix formed from an organic polymer and an aminoplast crosslinking agent). The reflective article also includes an outer organic polymer coating, that can be electrodeposited over the sacrificial cathodic layer.

22 Claims, 9 Drawing Sheets

(56) References Cited

U.S. PATENT DOCUMENTS

| | | | |
|---|---|---|---|
| 3,984,299 A | 10/1976 | Jerabek | |
| 4,046,729 A | 9/1977 | Scriven et al. | |
| 4,379,040 A | 4/1983 | Gillery | |
| 4,707,405 A * | 11/1987 | Evans | C03C 17/3647 252/387 |
| 4,715,898 A | 12/1987 | Johnson | |
| 4,746,347 A | 5/1988 | Sensi | |
| 4,792,536 A | 12/1988 | Pecoraro et al. | |
| 4,861,669 A | 8/1989 | Gillery | |
| 4,898,789 A | 2/1990 | Finley | |
| 4,898,790 A | 2/1990 | Finley | |
| 4,900,633 A | 2/1990 | Gillery | |
| 4,920,006 A | 4/1990 | Gillery | |
| 4,938,857 A | 7/1990 | Gillery | |
| 5,030,593 A | 7/1991 | Heithoff | |
| 5,030,594 A | 7/1991 | Heithoff | |
| 5,071,904 A | 12/1991 | Martin et al. | |
| 5,215,832 A | 6/1993 | Hughes et al. | |
| 5,240,886 A | 8/1993 | Gulotta et al. | |
| 5,328,768 A | 7/1994 | Goodwin | |
| 5,385,872 A | 1/1995 | Gulotta et al. | |
| 5,393,593 A | 2/1995 | Gulotta et al. | |
| 5,492,750 A | 2/1996 | Shumaker, Jr. et al. | |
| 5,543,227 A * | 8/1996 | Hughes | C09D 5/084 359/838 |
| 5,753,019 A * | 5/1998 | Stephen | C09D 5/082 106/14.24 |
| 6,562,990 B1 | 5/2003 | St. Clair et al. | |
| 6,869,644 B2 | 3/2005 | Buhay et al. | |
| 6,916,542 B2 | 7/2005 | Buhay et al. | |
| 6,962,759 B2 | 11/2005 | Buhay et al. | |
| 7,311,961 B2 | 12/2007 | Finley et al. | |
| 8,498,047 B2 * | 7/2013 | Ishihara | G02B 5/0858 359/360 |
| 2001/0033935 A1 * | 10/2001 | Laroche | C03C 17/38 428/432 |
| 2002/0172775 A1 | 11/2002 | Buhay et al. | |
| 2003/0054193 A1 | 3/2003 | McCollum et al. | |
| 2003/0228476 A1 | 12/2003 | Buhay et al. | |
| 2008/0199721 A1 | 8/2008 | Scott et al. | |
| 2009/0233037 A1 | 9/2009 | Medwick et al. | |
| 2010/0044235 A1 | 2/2010 | Scott et al. | |
| 2012/0114969 A1 | 5/2012 | Stremsdoerfer | |

\* cited by examiner

US 9,758,426 B2

REFLECTIVE ARTICLE HAVING A SACRIFICIAL CATHODIC LAYER

NOTICE OF GOVERNMENT SUPPORT

This invention was made with Government support under Contract No. DE-FC36-08GO18033 (DOE SOLAR POWER) awarded by the Department of Energy. The United States government may have certain rights in this invention.

FIELD OF THE INVENTION

The present invention relates generally to reflective articles that include a substrate, such as glass, having a multi-layered coating thereon that includes a lead-free sacrificial cathodic layer, which can be used for reflecting electromagnetic radiation, such as electromagnetic solar radiation.

BACKGROUND OF THE INVENTION

Solar power is becoming a more commercially acceptable and economically viable source of energy, due in part to the increasing costs of fossil fuels. With some solar energy systems, mirrors are used to reflect and concentrate or focus solar energy for purposes including, for example, heating a fluid and/or generating electricity. Mirrors that are capable of reflecting a sufficiently high level of solar radiation can be used in concentrated solar thermal power (CSTP) installations. Numerous mirror geometries can be used with CSTP installations. Typically, curved parabolic solar mirrors are used to concentrate solar energy onto conduits positioned along a focal line of the parabolic mirrors. A heat transfer fluid passing through the conduits carries absorbed heat energy to a generator station where it is used for power generation, such as electricity. Another known CSTP system is composed of a vertical solar tower surrounded by a number of pivotally adjustable flat solar mirrors, which reflect and direct solar energy at a particular location on the vertical tower. The heat generated by the solar energy focused on the vertical tower is transferred to a heat transfer material, and the heated and/or molten transfer material is used for power generation.

Other solar energy systems involve the use of solar mirrors to reflect and concentrate or focus solar energy onto high-efficiency photovoltaic (PV) devices, so as to increase or maximize the energy output for each PV device. Such solar energy systems are typically referred to as concentrated photovoltaic (CPV) systems.

Mirrors used in such solar energy systems are typically required to reflect a maximum level of solar energy. At the same time, such mirrors are also required to have a long service life, for example, having a minimum reduction in reflectance as a function of time, so as to minimize the need for replacing the mirrors.

Mirrors, and in particular solar mirrors which are typically exposed to outdoor environments, are prone to edge and surface corrosion, which can result in reduced reflectance of the mirrors. The reflective layer or layers of the mirror are often degraded due to the effects of corrosion. To reduce corrosion, mirrors are typically fabricated with one or more lead containing layers, which are typically sacrificial layers. Mirrors fabricated with lead containing layers generally have a reduced level of corrosion and longer life. The presence of the lead-containing layers can, however, represent an environmental hazard during fabrication and/or disposal of the mirrors. Addressing lead related environmental hazards can increase production and/or disposal costs associated with such mirrors.

It would be desirable to develop new mirrors, such as solar mirrors, that have a combination of high reflectance, high resistance to corrosion, and long life. It would be further desirable that such newly developed mirrors be free of lead containing layers.

SUMMARY OF THE INVENTION

In accordance with the present invention, there is provided a reflective article that includes: a substrate; a primary reflective coating formed over the substrate; and a sacrificial cathodic layer formed over at least a portion of the primary reflective coating, in which the sacrificial cathodic layer includes at least one transition metal and is free of lead. The reflective article also includes an outer organic polymer coating formed over the sacrificial cathodic layer. The outer organic polymer layer is free of lead.

With some embodiments of the present invention, the reflective article comprises: a transparent substrate having a first major surface and a second major surface; a basecoat formed over at least a portion of the second major surface; a primary reflective coating formed over at least a portion of the basecoat; an inorganic protective coating formed over at least a portion of the primary reflective coating; a sacrificial cathodic layer formed over at least a portion of the inorganic protective coating, in which the sacrificial cathodic layer comprises at least one transition metal, and is free of lead; and an outer organic polymer coating formed over the sacrificial cathodic layer, in which the outer organic polymer coating is free of lead.

With some further embodiments of the present invention, the reflective article comprises: a transparent substrate having a first major surface and a second major surface; a basecoat formed over at least a portion of the second major surface; a primary reflective coating formed over at least a portion of the basecoat; an anti-corrosion coating formed over at least a portion of the primary reflective coating, in which the anti-corrosion coating comprises a nickel alloy, and which can have a thickness of from 20 nm to 40 nm in some embodiments; a top coat formed over at least a portion of the anti-corrosion coating, in which the top coat comprises at least one layer comprising a material selected from zinc oxide, tin oxide, or zinc stannate, and which can have a thickness of 100 nm to 200 nm in some embodiments; an inorganic protective coating formed over at least a portion of the top coat; a sacrificial cathodic layer formed over at least a portion of the inorganic protective coating, in which the sacrificial cathodic layer comprises at least one transition metal, and is free of lead, and in which the transition metal is a particulate transition metal; and an outer organic polymer coating formed over the sacrificial cathodic layer, in which the outer organic polymer coating is free of lead.

BRIEF DESCRIPTION OF THE DRAWINGS

In FIGS. 1 through 9, which are not to scale, like reference characters designate the same components and structural features.

DETAILED DESCRIPTION OF THE INVENTION

Figure 1:
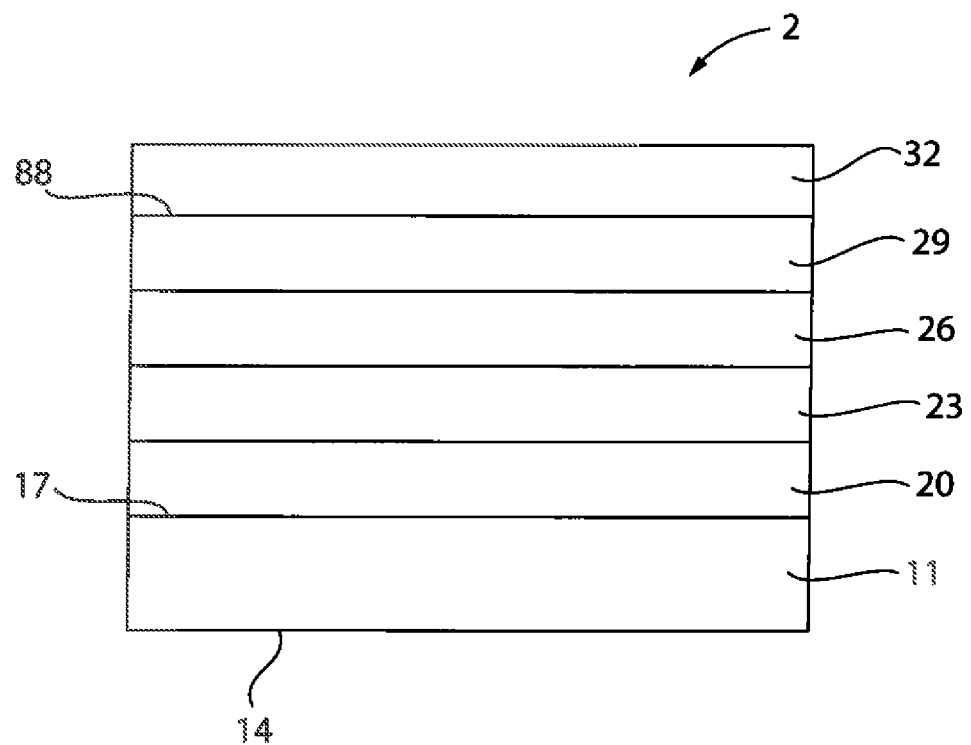
FIG. 1 is a representative sectional view of a reflective article according to the present invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting.

Other than in the operating examples, or where otherwise indicated, all numbers expressing quantities of ingredients, reaction conditions, processing parameters, physical characteristics, dimensions, and the like used in the specification and claims are to be under stood as modified in all instances by the term "about." Accordingly, unless indicated to the contrary, the numerical values set forth in the following specification and claims can vary depending upon the desired properties sought to be obtained by the present invention.

Additionally, at the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like.

As used herein, the terms "formed over," "deposited over," or "provided over" mean formed, deposited, or provided on but not necessarily in direct (or abutting) contact with the surface. For example, a coating layer "formed over" a substrate does not preclude the presence of one or more other coating layers or films of the same or different composition located between the formed coating layer and the substrate.

As used herein, the terms "polymer" or "polymeric" include oligomers, homopolymers, and copolymers (i.e., polymers formed from two or more types of monomers, such as, but not limited to terpolymers).

As used herein and in the claims, molecular weight values of polymers, such as weight average molecular weights (Mw) and number average molecular weights (Mn), are determined by gel permeation chromatography using appropriate standards, such as polystyrene standards.

As used herein and in the claims, polydispersity index (PDI) values represent a ratio of the weight average molecular weight (Mw) to the number average molecular weight (Mn) of the polymer (i.e., Mw/Mn).

As used herein and in the claims, the term "(meth) acrylate" and similar terms, such as "(meth)acrylic" and "esters of (meth)acrylic acid" means acrylates, methacrylates, and combinations thereof. Correspondingly, as used herein and in the claims, the term "(meth)acrylic acid" means acrylic acid, methacrylic acid and combinations thereof.

The term "visible region" and related terms, such as "visible light" as used herein mean electromagnetic radiation having a wavelength in the range of 380 nm to 780 nm.

The term "infrared region" and related terms, such as "infrared radiation" as used herein mean electromagnetic radiation having a wavelength in the range of greater than 780 nm to 100,000 nm.

The term "ultraviolet region" and related terms, such as "ultraviolet radiation" mean electromagnetic energy having a wavelength in the range of 100 nm to less than 380 nm.

All documents, such as but not limited to issued patents and patent applications, referred to herein are to be considered to be "incorporated by reference" in their entirety.

Parameters used herein, such as "visible transmission" and "visible reflection" and the like are those determined using conventional methods. Those skilled in the art will understand that properties such as visible transmission or visible reflection can vary based on the physical dimensions, such as thickness, of the article being tested. As such, any comparison to the present invention should be calculated at an equivalent thickness.

The reflective articles of the present invention can be used as solar mirrors that reflect electromagnetic solar radiation. As used herein, the term "solar mirror" refers to any article configured to reflect electromagnetic solar radiation, such as visible and/or infrared and/or ultraviolet radiation (e.g., for use in concentrated solar power systems). It is to be understood, however, that the invention is not limited to use with solar mirrors, but can be practiced with articles in other fields, such as but not limited to laminated or non-laminated residential and/or commercial mirrors, or reflectors for high-performance optical systems (e.g., video projectors or optical scanners), just to name a few. Therefore, it is to be understood that the embodiments more specifically disclosed herein are presented for purposes of explaining the general concepts of the invention, and that the invention is not limited to these specifically disclosed embodiments.

As used herein, the term "halo" and similar terms, such as halo group, halogen, and halogen group means F, Cl, Br and/or I, such as fluoro, chloro, bromo and/or iodo.

As used herein the term "hydrocarbyl" and similar terms, such as "hydrocarbyl substituent" and "hydrocarbyl group" means: linear or branched $C_1$-$C_{20}$ alkyl (e.g., linear or branched $C_1$-$C_{10}$ alkyl); linear or branched $C_2$-$C_{20}$ alkenyl (e.g., linear or branched $C_2$-$C_{10}$ alkenyl); linear or branched $C_2$-$C_{20}$ alkynyl (e.g., linear or branched $C_2$-$C_{10}$ alkynyl); $C_3$-$C_{12}$ cycloalkyl (e.g., $C_3$-$C_{10}$ cycloalkyl); $C_3$-$C_{12}$ heterocycloalkyl (having at least one hetero atom in the cyclic ring); $C_5$-$C_{18}$ aryl (including polycyclic aryl groups) (e.g., $C_5$-$C_{10}$ aryl); $C_5$-$C_{18}$ heteroaryl (having at least one hetero atom in the aromatic ring); and $C_6$-$C_{24}$ aralkyl (e.g., $C_6$-$C_{10}$ aralkyl).

Representative alkyl groups include but are not limited to methyl, ethyl, propyl, isopropyl, butyl, isobutyl, sec-butyl, tert-butyl, pentyl, neopentyl, hexyl, heptyl, octyl, nonyl and decyl. Representative alkenyl groups include but are not limited to vinyl, allyl and propenyl. Representative alkynyl groups include but are not limited to ethynyl, 1-propynyl, 2-propynyl, 1-butynyl, and 2-butynyl. Representative cycloalkyl groups include but are not limited to cyclopropyl, cyclobutyl, cyclopentyl, cyclohexyl, and cyclooctyl substituents. Representative heterocycloalkyl groups include but are not limited to tetrahydrofuranyl, tetrahydropyranyl and piperidinyl. Representative aryl groups include but are not limited to phenyl and naphthyl. Representative heteroaryl groups include but are not limited to furanyl, pyranyl and pyridinyl. Representative aralkyl groups include but are not limited to benzyl, and phenethyl.

The term "substituted hydrocarbyl" as used herein means a hydrocarbyl group in which at least one hydrogen thereof has been substituted with a group that is other than hydrogen, such as, but not limited to, halo groups, hydroxyl groups, ether groups, thiol groups, thio ether groups, carboxylic acid groups, carboxylic acid ester groups, phosphoric acid groups, phosphoric acid ester groups, sulfonic acid groups, sulfonic acid ester groups, nitro groups, cyano groups, hydrocarbyl groups (e.g., alkyl, alkenyl, alkynyl, cycloalkyl, heterocycloalkyl, aryl, heteroaryl, and aralkyl groups), and amine groups, such as —N($R_{11}$')($R_{12}$') where $R_{11}$' and $R_{12}$' are each independently selected from hydrogen, hydrocarbyl and substituted hydrocarbyl, or $R_{11}$' and $R_{12}$' together form a cyclic ring optionally including at least one heteroatom (e.g., —O— and/or —S—).

The term "substituted hydrocarbyl" is inclusive of halohydrocarbyl (or halo substituted hydrocarbyl) substituents. The term "halohydrocarbyl" as used herein and in the claims, and similar terms, such as halo substituted hydrocarbyl, means that at least one hydrogen atom of the hydrocarbyl (e.g., of the alkyl, alkenyl, alkynyl, cycloalkyl, heterocycloalkyl, aryl, heteroaryl, and aralkyl groups) is replaced with a halogen atom selected from chlorine, bromine, fluorine and iodine. The degree of halogenation can range from at least one hydrogen atom being replaced by a halogen atom (e.g., a fluoromethyl group) to full halogenation (perhalogenation) in which all replaceable hydrogen atoms on the hydrocarbyl group have been replaced by a halogen atom (e.g., trifluoromethyl or perfluoromethyl). Correspondingly, the term "perhalohydrocarbyl group" as used herein and in the claims means a hydrocarbyl group in which all replaceable hydrogens have been replaced with a halogen. Examples of perhalohydrocarbyl groups include, but are not limited to, perhalogenated phenyl groups and perhalogenated alkyl groups.

With some embodiments, the hydrocarbyl and substituted hydrocarbyl groups can in each case be independently and optionally interrupted with at least one of —O—, —S—, —C(O)—, —C(O)O—, —S(O)—, —N($R_{11}$')—. As used herein, by interrupted with at least one of —O—, —S—, —C(O)—, —C(O)O—, —S(O)—, —N($R_{11}$')—, means that at least one carbon of, but less than all of the carbons of, the hydrocarbyl group or substituted hydrocarbyl group, is in each case independently replaced with one of the recited divalent linking groups. The hydrocarbyl and substituted hydrocarbyl groups can be interrupted with two or more of the above recited linking groups, which can be adjacent each other or separated by one or more carbons.

As used herein and in the claims, recitations of "linear or branched" or "linear, branched or cyclic" groups, such as linear or branched alkyl, or linear, branched or cyclic alkyl, are herein understood to include: a methylene group or a methyl group; groups that are linear, such as linear $C_2$-$C_{25}$ alkyl groups; groups that are appropriately branched, such as branched $C_3$-$C_{25}$ alkyl groups; and groups that are appropriately cyclic, such as $C_3$-$C_{25}$ cycloalkyl (or cyclic $C_3$-$C_{25}$ alkyl) groups.

As used herein and in the claims, unless otherwise indicated, left-to-right representations of linking groups, such as divalent linking groups, are inclusive of other appropriate orientations, such as, right-to-left orientations. For purposes of non-limiting illustration, the left-to-right representation of the divalent linking group —C(O)O—, is inclusive of the right-to-left representation thereof, —O(O)C—.

As used herein, the articles "a," "an," and "the" include plural referents unless otherwise expressly and unequivocally limited to one referent.

As used herein the term "transparent" means having a transmission of greater than 0% up to 100% in a desired wavelength range, such as visible light. As used herein the term "translucent" means allowing electromagnetic radiation, such as visible light, to be transmitted but diffusing or scattering this electromagnetic radiation. As used herein the term "opaque" means having a transmission of substantially 0%, such as 0%, in a desired wavelength range, such as visible light.

Reflective articles according to some non-limiting embodiments of the present invention can be described with reference to FIG. 1. With reference to FIG. 1, reflective article 2, which can be a solar mirror, includes a transparent substrate 11. Transparent substrate 11 has a first major surface 14, and a second major surface 17, which are opposed from each other. First major surface 14 can be referred to an outer surface. First major surface 14 typically faces towards the incident electromagnetic radiation, such as incident solar radiation. Second major surface 17 typically faces opposite the incident electromagnetic radiation. A basecoat 20 is formed over at least a portion of second major surface 17 of transparent substrate 11. One or more optional layers (not shown), which are typically inorganic layers, can be interposed between second major surface 17 and basecoat 20. Basecoat 20 can be a single or multilayered basecoat, as will be discussed in further detail herein. As depicted in FIG. 1, basecoat 20 is formed directly on or over and abuts second major surface 17 of transparent substrate 11. A primary reflective coating 23 is formed over at least a portion of basecoat 20. Primary reflective coating 23 can be a single or multilayered reflective coating. One or more optional layers can be interposed between primary reflective coating 23 and basecoat 20. As depicted in FIG. 1, primary reflective coating 23 is formed directly on or over and abuts basecoat 20. An inorganic protective coating 26 is formed over at least a portion of primary reflective coating 23. Inorganic protective coating 26 can be a single layer or multilayered inorganic coating. One or more optional layers can be interposed between primary reflective coating 23 and inorganic protective coating 26. As depicted in FIG. 1, inorganic protective coating 26 is formed directly on or over and abuts primary reflective coating 23.

Reflective article 2 of FIG. 1 further includes a sacrificial cathodic layer 29, which is formed over at least a portion of inorganic protective coating 26. Sacrificial cathodic layer 29 can be a single or multilayered sacrificial layer. Sacrificial cathodic layer 29 has an upper surface 88. One or more further optional layers can be interposed between inorganic protective coating 26 and sacrificial cathodic layer 29, such as one or more adhesion promoting layers or treatments. As depicted in FIG. 1, sacrificial cathodic layer 29 is formed directly on or over and abuts inorganic protective coating 26.

With further reference to FIG. 1, reflective article 2 also includes an outer polymer coating 32 formed over sacrificial cathodic layer 29. Outer polymer coating 32 can be a single or multilayered outer polymer coating. One or more additionally optional layers can be interposed between sacrificial cathodic layer 29 and outer organic polymer coating 32. As depicted in FIG. 1, outer organic polymer coating 32 is formed directly on or over and abuts sacrificial cathodic layer 29.

The sacrificial cathodic layer of the reflective article of the present invention includes at least one transition metal, and is free of lead. By "free of lead" means the sacrificial cathodic layer contains substantially no lead, such as less than 0.001 weight percent lead, or less than 0.0001 weight percent lead, such as substantially 0 weight percent lead, based on total weight of the sacrificial cathodic layer. The term "lead" with regard to the sacrificial cathodic layer includes elemental lead, organo-lead compounds, lead-metal alloys, lead-metal mixtures, and combinations thereof.

Transition metals that can be included in the sacrificial cathodic layer can be selected from one or more of the transition metals (or elements) of the periodic table of the elements, such as the elements in groups 3 through 12 of the periodic table of the elements. The transition metal of the sacrificial cathodic layer can be selected from one or more transition metals, mixtures of two or more transition metals, alloys of two or more transition metals, and combinations thereof.

With some embodiments of the present invention, the transition metal of the sacrificial cathodic layer is selected from zinc, aluminum, copper, magnesium, alloys of two or more thereof, mixtures of two or more thereof, and combinations of two or more thereof. The transition metal of the sacrificial cathodic layer, according to some further embodiments, can be selected from zinc, organo-zinc compounds, and combinations thereof. The organo group or groups of the organo-zinc compounds each independently being selected from one or more hydrocarbyl and substituted hydrocarbyl groups.

The sacrificial cathodic layer can be applied or formed, with some embodiments, by methods including, but not limited to: wet chemical methods, such as precipitation of the layer from solution, electroless plating, sol-gel chemistry, etc.; electrochemical methods, such as electroplating or electrodeposition; sputter deposition, such as magnetron sputter vapor deposition (MSVD); evaporation methods, such as thermal evaporation or electron beam evaporation; chemical vapor deposition (CVD); spray pyrolysis; flame-spraying; plasma-spraying; liquid spray application; powder spray application; spin coating; doctor blade coating; or curtain coating.

According to some embodiments, the sacrificial cathodic layer abuts (or is applied over) an underlying adhesion promoter or adhesion promoting layer. For example and with some embodiments, an adhesion promoter or adhesion promoting layer (not shown in the drawings) is interposed between the sacrificial cathodic layer (e.g., 29) and the inorganic protective coating (e.g., 26). The adhesion promoter or adhesion promoting layer can include art-recognized adhesion promoting materials. According to some embodiments, the sacrificial cathodic layer is formed or applied directly over a previously applied adhesion promoter composition that includes one or more silanes, such as amine functional silanes (e.g., aminoalkyltrialkoxysilanes) and oxirane functional silanes (e.g., glycidoxyalkyltrialkoxysilanes). An example of an amine functional silane is gamma-aminopropyltriethoxysilane, and an example of an oxirane functional silane is gamma-glycidoxypropyltrimethoxysilane.

The transition metal of the sacrificial cathodic layer, according to some embodiments, is a particulate transition metal. The particulate transition metal can have shapes selected from, but not limited to, spherical shapes, oval shapes, flake shapes (or flakes), irregular shapes, cubic shapes, fibrous shapes, and combinations thereof. The particulate transition metal can have wide range of particle sizes, which are typically described as average particle sizes with regard to the largest dimension (e.g., width or height) of the particles. For example, the particulate transition metal can have an average particle size of greater than 0 microns (or micrometers) and less than or equal to 100 microns, such as from 0.1 to 50 microns, or from 0.5 to 40 microns, or from 1 to 30 microns. The particulate transition metal can have a wide range of aspect ratios (width:height), such as from greater than or equal to 1:1, to less than or equal to 100:1, or from 1.5:1 to 50:1, or from 2:1 to 20:1. According to some embodiments, the particulate transition metal has a form of flakes (or is in the form of flakes), which can have an elongated dimension (or width) of up to 200 microns, such as an elongated dimension of from 10 to 150 microns, or from 20 to 125 microns, or from 30 to 110 microns.

With some embodiments of the present invention, the sacrificial cathodic layer includes particulate transition metal, and an inorganic matrix formed from at least one organo-titanate. As used herein, the term "inorganic matrix" with regard to the sacrificial cathodic layer includes hybrid organic-inorganic polymer matrices, as will be described in further detail herein. As used herein, the term "organo-titanate" includes, but is not limited to, organo-titanates, chelated organo-titanates, partially hydroylsated organo-titanates, and combinations thereof. Generally, organo-titanates can be represented by the formula $(RO)_4Ti$, in which each R is independently selected from hydrocarbyl and substituted hydrocarbyl, which can each be optionally interrupted with at least one of —O—, —S—, —C(O)—, —C(O)O—, —S(O)—, —SO$_2$—, —N($R_{11}$')— where $R_{11}$' is selected from hydrogen, hydrocarbyl, or substituted hydrocarbyl, and combinations of two or more thereof. As used herein and in the claims, by interrupted with at least one of —O—, —S—, —C(O)—, —C(O)O—, —S(O)—, —SO$_2$—, —N($R_{11}$')—, means that at least one carbon of, but less than all of the carbons of, the hydrocarbyl group or substituted hydrocarbyl group, is in each case independently replaced with one of the recited divalent linking groups. The hydrocarbyl and substituted hydrocarbyl groups can be interrupted with two or more of the above recited linking groups, which can be adjacent to each other or separated by one or more carbons.

The organo-titanates, with some embodiments, can be represented by the following Formula I.

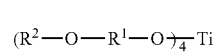

Formula I

With reference to Formula I, $R^1$ and $R^2$ are in each instance independently selected from hydrocarbyl and substituted hydrocarbyl groups. According to some embodiments, $R^1$ can more particularly be selected from a linear, branched or cyclic divalent $C_1$-$C_{20}$ alkyl (or alkylene) group, such as methylene, ethylene, n-propylene, iso-propylene, etc. The $R^2$ group of Formula I can with some embodiments be selected from linear, branched or cyclic $C_1$-$C_{20}$ alkyl groups. With some embodiments, $R^1$ is selected from linear or branched $C_1$-$C_5$ alkyl, such as ethylene (—$CH_2CH_2$—), and $R^2$ is selected from linear or branched $C_6$-$C_{20}$ alkyl, such as octyl.

Examples of titanates that can be used in the present invention include, but are not limited to those described in U.S. Pat. No. 6,562,990 at col. 4, line 63 to col. 5, line 9, the cited portion of which being incorporated herein by reference. Further examples of titanates that can be used in the present invention, include, but are not limited to, those commercially available from DuPont under the tradename TYZOR®, such as TYZOR® TPT, which refers to tetraisopropyl titanate, TYZOR® TnBT, which refers to tetra-n-butyl titanate, and TYZOR® TOT, and which refers to tetra-2-ethylhexyl titanate.

Examples of chelated titanates that can be used in the present invention include, but are not limited, to those described in U.S. Pat. Nos. 2,680,108 and 6,562,990, the disclosures of which are incorporated herein by reference each in their entirety. In certain embodiments of the present invention, a chelated titanate is used that is formed from a chelating agent including a dicarbonyl compound. Examples of dicarbonyl compounds from which suitable chelated titanates can be prepared include, but are not limited to, the materials described in U.S. Pat. No. 2,680,108 at col. 2, lines 13-16 and U.S. Pat. No. 6,562,990 at col. 2, lines 56-64, the cited disclosures of which are incorporated herein by reference. Further examples of chelated titanates that can be used in the present invention, include, but are not limited to, those commercially available from DuPont under the tradename TYZOR®.

Generally, the particulate transition metal and organo-titanate are mixed together, optionally with additional materials including but not limited to, solvent, diluent, thixotropic agent, and/or surfactant, under sufficient shear, which results in formation of an inorganic coating composition. The inorganic coating composition is applied over an exposed layer of the reflective article, such as the inorganic protective coating. The applied inorganic coating is then subjected to an elevated temperature for a sufficient period of time, so as to result in formation of the sacrificial cathodic layer, which includes an inorganic matrix in which the particulate transition metal is dispersed and contained. The applied inorganic coating can be exposed to an elevated temperature of, for example, at least 149° C., or at least 163° C., or at least 177° C., such as from 149° C. to 204° C., for a period of time of at least 5 minutes, and typically less than or equal to 24 hours, such as from 15 minutes to 60 minutes.

With some embodiments of the present invention, the inorganic coating composition from which the sacrificial cathodic layer is formed, can optionally further include a polyfunctional organic polymer having at least two functional groups that are reactive with alkoxy groups, such as but not limited to, hydroxyl groups, thiol groups, primary amine groups, secondary amine groups, and protonic acid groups, such as carboxylic acid groups, and combinations of two or more thereof. The polyfunctional organic polymer reacts (or condenses) with the organo-titanate at elevated temperature, so as to form a hybrid organic-inorganic polymer matrix.

Examples of organic polymers from which the polyfunctional organic polymer can be selected include, but are not limited to, acrylic polymers, polyester polymers, polyurethane polymers, polyether polymers, silicon-based polymers, and combinations thereof. Silicon-based polymers include one or more —SiO— units in the backbone thereof.

With some embodiments, the polyfunctional organic polymer includes two or more hydroxyl groups, and can be referred to as a polyhydroxy compound, or polyol. Examples of polyols from which the polyfunctional organic polymer can be selected and/or include, include those described in U.S. Pat. No. 4,046,729, at col. 7, line 52 to col. 10, line 35, the cited portion of which is incorporated by reference.

With some embodiments of the present invention, the polyfunctional organic polymer having two or more hydroxyl groups is prepared from reaction of one or more aromatic polyols, such as a Bisphenol type polyols or diols (e.g., Bisphenol A, F, E, M, P and/or Z), and one or more alkylene oxides, such as ethylene oxide, propylene oxide, and/or butylene oxide. Examples of polyfunctional organic polymers having two or more hydroxyl groups that are prepared from aromatic polyol and alkylene oxide include, but are not limited to, those commercially available from BASF under the tradename MACOL. With some embodiments, the polyfunctional organic polymer having two or more hydroxyl groups is prepared from six moles of ethylene oxide reacted with one mole of Bisphenol A, which is commercially available under the tradename MACOL 98B polyol.

With some embodiments, at least a portion of the hybrid organic-inorganic polymer matrix of the sacrificial cathodic layer can be represented by the following Formula II.

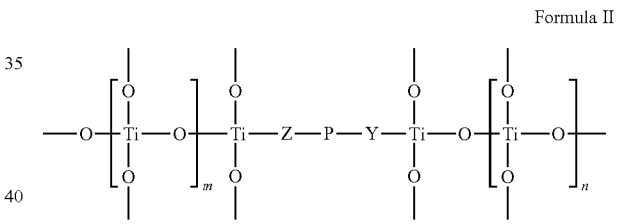

Formula II

With reference to Formula II, P is derived from, or represents a residue of, the polyfunctional organic polymer. The Z and Y groups of Formula II, are each independently selected from a residue of a functional group of the polyfunctional organic polymer, such as, —O—, —S—, —NH—, —N(R')— where R' is a hydrocarbyl or substituted hydrocarbyl group, and —C(O)O—. The polymer as depicted in hybrid organic-inorganic polymer matrix represented by Formula II, is a difunctional organic polymer having two functional groups reactive with the alkoxy groups of the titanate. As described previously herein, the polyfunctional organic polymer can include more than two (e.g., three or more) such functional groups, which are not depicted in, but which could be extrapolated from the representation provided by Formula II.

With further reference to Formula II, m and n are each independently at least 0, provided the sum of m and n is greater than 0. With some embodiments of the present invention, m and n are each independently from 0 to 100, or from 1 to 50, or from 1 to 10, provided the sum of m and n is greater than zero. The hybrid organic-inorganic polymer matrix, or portion thereof, of the sacrificial cathodic layer represented by Formula II, can include more than one residue (e.g., two or more residues) of the polyfunctional organic polymer.

With further reference to the hybrid organic-inorganic polymer matrix, or portion thereof, represented by Formula II, when m and/or n are each at least 1, water can be added to the titanate to form a partial hydrolysate. Formation of the hydrolysate (e.g., by addition of water) can be conducted prior to, during, and/or after addition of the polyfunctional organic polymer. Alternatively, or additionally, preformed partial hydrolysates can be used, such as partial hydrolysates commercially available from DuPont under the tradename TYZOR, such as TYZOR BTP (n-butyl polytitanate).

With some embodiments of the present invention, when the sacrificial cathodic layer includes particulate transition metal, such as in the form of flakes, and an inorganic matrix formed from at least one organo-titanate, the sacrificial cathodic layer is substantially free of an organic polymer matrix. As used herein and in the claims, the term "substantially free of an organic polymer matrix" with regard to the sacrificial cathodic layer, means the sacrificial cathodic layer is free of an organic polymer matrix that does not include titanate residues, such as represented by the following Formula III, covalently bonded to the organic polymer.

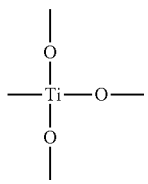

Formula III

Further as used herein and in the claims, the term "substantially free of an organic polymer matrix" with regard to the sacrificial cathodic layer does not include hybrid organic-inorganic polymer matrices.

The amount of polyfunctional organic polymer used to form the hybrid organic-inorganic polymer matrix is typically less than or equal to 1 part by weight, per 1 part by weight of titanate, measured on the basis of theoretical $TiO_2$ content in the resulting hybrid organic-inorganic polymer matrix. For example, the hybrid organic-inorganic polymer matrix can be produced by reacting titanate and polyfunctional organic polymer in a weight ratio of, from 1 to 6, or 3 to 5, parts by weight titanate, measured on the basis of theoretical $TiO_2$ content in the resulting hybrid organic-inorganic polymer matrix, to 1 part by weight of the polyfunctional organic polymer.

When the sacrificial cathodic layer includes particulate transition metal, and an inorganic matrix formed from at least one organo-titanate, the transition metal is typically present in an amount of at least 50 percent by weight, and less than 100 percent by weight, such as from 50 to 98 percent by weight, or from 55 to 95 percent by weight, or from 60 to 90 percent by weight, or from 90 to 98 percent by weight, or from 93 to 97 percent by weight, based on the total weight of solids of the composition from which the inorganic matrix is formed, or the total weight of the resulting inorganic matrix. Correspondingly, the organo-titanate and optional polyfunctional organic polymer can be present in an amount of greater than 0 percent by weight, and less than or equal to 50 percent by weight, such as from 2 to 50 percent by weight, or from 5 to 45 percent by weight, or from 10 to 40 percent by weight, or from 2 to 10 percent by weight, or from 3 to 7 percent by weight, based on the total weight of solids of the composition from which the inorganic matrix is formed, or the total weight of the resulting inorganic matrix.

The inorganic coating compositions from which the sacrificial cathodic layer can be prepared, so as to include particulate transition metal and an inorganic matrix formed from at least one organo-titanate, can include other materials, as described previously herein. More particularly, with some embodiments, the inorganic coating compositions can include a diluent so that the inorganic coating composition will have a desired viscosity for application by conventional coating techniques. Diluents include at least one functional group that is reactive with the alkoxy groups of the organo-titanate. Examples of diluents that can be used include, but are not limited to, alcohols, such as those having up to about 8 carbon atoms, such as ethanol and isopropanol and alkyl ethers of glycols, such as 1-methoxy-2-propanol, and monoalkyl ethers of ethylene glycol, diethylene glycol and propylene glycol.

Alternatively or in addition to one or more diluents, the inorganic coating compositions can optionally include one or more solvents. Solvents that can be used include, but are not limited to, ketones, such as methyl ethyl ketone, methyl isobutyl ketone and isophorone; esters and ethers, such as 2-ethoxyethyl acetate and 2-ethoxyethanol; aromatic hydrocarbons, such as benzene, toluene, and xylene; and aromatic solvent blends derived from petroleum, such as those sold commercially under the trademark SOLVESSO®. The amount of diluent and/or solvent can vary depending on the method of coating, the inorganic binder component, the weight ratio of particulate transition metal to inorganic binder (e.g., organo-titanate and optional polyfunctional organic polymer), and the presence of further optional ingredients, such as those described below.

With some embodiments, pigments can be included in the inorganic coating compositions from which the sacrificial cathodic layer can be prepared. Examples of such pigments include, but are not limited to, carbon black, magnesium silicate (e.g., talc), and/or zinc oxide. With some further embodiments, the inorganic coating compositions can alternatively or additionally include one or more organic pigments, such as, but not limited to: azo compounds (monoazo, di-azo, β-Naphthol, Naphthol AS, azo pigment lakes, benzimidazolone, di-azo condensation, metal complex, isoindolinone, isoindoline); polycyclic compounds (phthalocyanine, quinacridone, perylene, perinone, diketopyrrolo pyrrole, thioindigo, anthraquinone, indanthrone, anthrapyrimidine, flavanthrone, pyranthrone, anthanthrone, dioxazine, triarylcarbonium, quinophthalone); and combinations thereof.

With some embodiments of the present invention, the inorganic coating composition from which the sacrificial cathodic layer is formed, can optionally further include one or moisture scavengers. The moisture scavengers can be selected from art-recognized materials, such as, but not limited to, microporous aluminosilicate materials, silanes, and combinations thereof. Examples of microporous aluminosilicate materials include, but are not limited to, zeolites. Examples of silanes include, but are not limited to, oxirane functional silanes, such as glycidoxyalkyltrialkoxysilanes. An example of an oxirane functional silane is gamma-glycidoxypropyltrimethoxysilane. The moisture scavenger can be present in the inorganic coating composition from which the sacrificial cathodic layer is formed in a suitable amount, such as less than or equal to 10 percent, or less than or equal to 5 percent by weight, based on total weight of the inorganic coating composition. With some embodiments, the moisture scavenger includes at least one microporous aluminosilicate material, such as one or more zeolites, and one or more oxirane functional silanes, such as gamma-glycidoxypropyltrimethoxysilane, each being present in an amount of 1 percent by weight, based on total weight of the inorganic coating composition.

The inorganic coating compositions from which the sacrificial cathodic layer can be prepared, so as to include particulate transition metal and an inorganic matrix formed from at least one organo-titanate, are described in further detail in United States Patent Application Publication Numbers US 2008/0199721 A1, and US 2010/0044235 A1, the disclosures of which are each incorporated herein by reference in their entireties.

The outer organic polymer coating (e.g., 32 of FIG. 1) is applied over, or directly onto, the sacrificial cathodic layer. The outer organic polymer coating can be applied by coating methods including, but not limited to, liquid spray application, powder coating application (including spray and fluid bed application methods), dip coating, doctor blade application, electroless curtain coating, spin application, and electrodeposition methods, including electrodeposition curtain coating methods as will be described in further detail herein.

The outer organic polymer coating can include any suitable polymer. With some embodiments, the outer organic polymer coating includes a polymer selected from polyester polymers, acrylic polymers, polycarbonate polymers, polyether polymers, polyurethane polymers, and combinations of two or more thereof. The outer organic polymer coating can be a thermoplastic coating, a crosslinked (e.g., thermoset) coating, or a combination thereof. Typically, the outer organic polymer coating is a crosslinked coating, having a crosslinked organic polymer matrix. The outer organic polymer coating can optionally include additives selected from, for example, ultraviolet light stabilizers, thermal stabilizers, flow control agents, dyes, pigments, such as inorganic and/or organic pigments, reinforcing agents, such as inorganic and/or organic fibers, and combinations thereof. Additives can be present in the outer organic polymer coating in appropriate art-recognized amounts, such as from 0.1 to 60 percent by weight, based on total solids weight of the outer organic polymer coating.

The outer organic polymer coating can have any suitable thickness, provided it is capable of at least sufficiently protecting the underlying sacrificial cathodic layer from, for example, mechanical damage (e.g., scratches), and/or environmental damage (e.g., corrosion, such as due to humidity). Typically the outer organic polymer coating has a thickness of at least 10 microns, and less than or equal to 250 microns, such as from 15 to 150 microns, or from 20 to 100 microns.

In accordance with some further embodiments, the outer organic polymer coating is free of lead. By "free of lead" means the outer organic polymer coating contains substantially no lead, such as less than 0.001 weight percent lead, or less than 0.0001 weight percent lead, such as substantially 0 weight percent lead, based on total weight of the outer organic polymer coating. The term "lead" with regard to the outer organic polymer coating includes elemental lead, organo-lead compounds, lead-metal alloys, lead-metal mixtures, and combinations thereof. With some embodiments, the outer organic polymer coating includes a transition metal, independently selected from those as described previously herein with regard to the sacrificial cathodic layer, such as zinc flakes, and is free of lead.

In accordance with embodiments in which the outer organic polymer coating includes a transition metal, such as particulate zinc that can be in the form of zinc flakes, the transition metal can be present in an amount that is typically at least 1 percent by weight, and less than or equal to 80 percent by weight. With some embodiments, the outer organic polymer coating includes a transition metal, such as zinc flakes, in an amount of from 10 to 80 percent by weight, or from 25 to 60 percent by weight, or from 30 to 55 percent by weight, based on the total solids weight of the outer organic polymer coating.

In accordance with some embodiments of the present invention, when including particulate transition metal and an inorganic matrix formed from at least one organo-titanate, the sacrificial cathodic layer can be electrically conductive. By "electrically conductive" means the sacrificial cathodic layer has an electrical conductivity at least sufficient so as to allow the electrodeposition of another coating layer directly thereon/thereover. The sacrificial cathodic layer can, for example, have an electrical resistivity of less than or equal to 5 megaohms/cm$^2$, such as from 0.5 to 5 megaohms/cm$^2$, inclusive of the recited values.

The electrodeposited coating can be cationically electrodeposited or anionically electrodeposited onto the electrically conductive sacrificial cathodic layer. With cationic electrodeposition methods, the sacrificial cathodic layer is the cathode (i.e., is the negatively charged electrode) of the direct current electrical circuit. With anionic electrodeposition methods, the sacrificial cathodic layer is the anode (i.e., is the positively charged electrode) of the direct current electrical circuit. The electodeposition coating is typically electrodeposited from an aqueous electodeposition bath containing from 5 to 30 percent by weight of solids, based on total weight of the aqueous electodeposition coating composition. The solids typically include at least one ionic (anionic or cationic) organic polymer, at least one curing agent, and optional materials, such as pigments, surfactants and/or emulsifiers.

With some embodiments, the sacrificial cathodic layer, which includes particulate transition metal and an inorganic matrix formed from at least one organo-titanate, is electrically conductive, and the outer organic polymer coating is cationically electrodeposited onto the sacrificial cathodic layer, which can include any suitable polymer, such as, but not limited to, polyester polymers, acrylic polymers (which can be equivalently referred to herein as a (meth)acrylic polymers), polycarbonate polymers, polyether polymers, polyurethane polymers, and combinations of two or more thereof. As such, with some embodiments, the sacrificial cathodic layer and the outer organic polymer coating abut each other, and the outer organic polymer coating composition is a cationically electrodeposited outer organic polymer coating.

The cationically electrodeposited outer organic polymer coating is typically electrodeposited from an aqueous cationic electrodeposition bath that includes from 5 to 30 percent by weight of solids, based on total weight of the aqueous cationic electrodeposition coating composition. The solids typically include a cationic organic polymer, a curing agent, which can also be referred to as a crosslinking agent or crosslinker, and optional materials, such as such as pigments, surfactants and/or emulsifiers.

The cationic organic polymer can be selected from any suitable organic polymer, such as, but not limited to: polyesters; polyether polymers, including polyether polymers formed from compounds having at least two active hydrogen groups (e.g., hydroxyl, thiol, primary amine, and/or secondary amine groups), and compounds having at least two oxirane groups; polyurethanes; (meth)acrylic polymers; and combinations of two or more thereof. The cationic organic polymer includes cationic groups (or cationic salt groups), or groups that can be converted to cationic groups (or cationic salt groups), such as primary amines, secondary amines, tertiary amines, sulfonium groups, and combinations thereof.

The cationic organic polymer typically has a cationic salt (e.g., amine salt or sulfonium salt) group equivalent weight of at least 1000 grams/equivalent, or at least 1500 grams/equivalent, or at least 2000 grams/equivalent. The cationic salt group equivalent weight of the cationic organic polymer is also typically less than 15,000 grams/equivalent, or less than 10,000 grams/equivalent, or less than 6000 grams/equivalent. The cationic salt group equivalent weight of the cationic organic polymer can range between any combination of these values, inclusive of the recited values, such as from 1000 to 15,000 grams/equivalent, or from 1500 to 10,000 grams/equivalent, or from 2000 to 6000 grams/equivalent. The cationic salt group equivalent weight of the cationic organic polymer, whether containing amine or sulfonium salt groups, can be determined in accordance with art-recognized titration methods. For example, when the cationic salt groups are amine salt groups, the equivalent weight can be determined, with some embodiments, in accordance with ASTM-D4370.

The cationic organic polymer also includes functional groups that are capable of forming covalent bonds with the reactive groups of the curing agent. Examples of functional groups that the cationic organic polymer can have include, but are not limited to: hydroxyl groups; thiol groups; primary and/or secondary amine groups that are not in the form of a cationic salt group; isocyanate groups, which are typically in the form of blocked isocyanate groups; oxirane groups; ethylenically unsaturated groups; and combinations of two or more thereof. Typically, the cationic organic polymer has active hydrogen functional groups, such as hydroxyl groups and/or thiol groups.

With some embodiments, the active hydrogen groups of the cationic organic polymer are hydroxyl groups. The cationic organic polymer can have a hydroxyl value of at least 50, or at least 100, or at least 300. The hydroxyl value of the cationic organic polymer can also be less than 500, or less than 400, or less than 350. The hydroxyl value of the cationic organic polymer can range between any combination of these values inclusive of recited values, such as from 50 to 500, or from 100 to 400, or from 300 to 350.

The number average molecular weight (Mn) of the cationic organic polymer, of the cationically electrodeposited outer organic polymer coating composition, can be at least 250, or at least 1000, or at least 2000. The cationic organic polymer also can have a Mn of less than 30,000, or less than 25,000, or less than 20,000. The Mn of the cationic organic polymer can range between any combination of these values, inclusive of the recited values, for example, from 250 to 30,000, or from 1000 to 25,000, or from 2000 to 20,000.

The cationic organic polymer of the cationically electrodeposited outer organic polymer coating can, in some embodiments, be a cationic acrylic polymer, and more particularly a cationic (meth)acrylic polymer. The cationic acrylic polymer can be prepared from ethylenically unsaturated and radically polymerizable monomers including, but not limited to, (meth)acrylate monomers, (meth)acrylic acid monomers, and optionally other ethylenically unsaturated radically polymerizable monomers, such as allylic monomers, vinyl aromatic monomers, and/or vinyl esters of carboxylic acids. Examples of (meth)acrylate monomers include, but are not limited to alkyl(meth)acrylates, such as alkyl(meth)acrylates having from 1 to 20 carbon atoms in the alkyl group, for example, methyl(meth)acrylate, ethyl (meth)acrylate, isopropyl(meth)acrylate, butyl(meth)acrylate, tert-butyl(meth)acrylate, 2-ethylhexyl(meth)acrylate, lauryl(meth)acrylate, isobornyl(meth)acrylate, isobutyl (meth)acrylate, cyclohexyl(meth)acrylate, and 3,3,5-trimethylcyclohexyl(meth)acrylate.

Examples of vinyl aromatic monomers from which the cationic acrylic polymer can be prepared include, but are not limited to, styrene, p-chloromethylstyrene, divinyl benzene, vinyl naphthalene and divinyl naphthalene.

Examples of vinyl esters of carboxylic acids from which the cationic acrylic polymer can be prepared include, but are not limited to, vinyl acetate, vinyl versatate, vinyl butyrate, vinyl benzoate, vinyl 3,4-dimethoxy benzoate and the like.

As used herein and in the claims, by "allylic monomer(s)" is meant monomers containing substituted and/or unsubstituted allylic functionality, in which one or more radicals represented by the following general Formula IV,

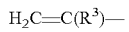

$$H_2C=C(R^3)-$$ Formula IV

With reference to Formula IV, $R^3$ is hydrogen, halogen or a $C_1$ to $C_4$ alkyl group. Typically, $R^3$ is hydrogen or methyl and consequently general Formula IV represents an unsubstituted (meth)allyl radical. Examples of allylic monomers include, but are not limited to: (meth)allyl alcohol; (meth) allyl ethers, such as methyl(meth)allyl ether; and (meth)allyl esters of carboxylic acids, such as (meth)allyl acetate.

With some embodiments the cationic organic polymer is a hydroxyl functional cationic organic polymer, which can be prepared from hydroxy-alkyl esters of (meth)acrylic acid containing from 1 to 4 carbon atoms in the hydroxy-alkyl group. Examples of hydroxyl functional (meth)acrylate monomers from which the cationic organic polymer can be prepared include, for example, hydroxy-ethyl(meth)acrylate and/or hydroxyl-propyl(meth)acrylate.

With further embodiments, the cationic organic polymer is a hydroxyl functional cationic organic polymer, which includes beta-hydroxy ester groups prepared from reacting an ethylenically unsaturated acid functional monomer and an epoxy (or oxirane) compound containing, for example, at least 5 carbon atoms. Examples of suitable ethylenically unsaturated acid functional monomers are (meth)acrylic acids. Examples of suitable epoxy (or oxirane functional) compounds include glycidyl esters and glycidyl ethers. Examples of glycidyl ethers include those containing from 8 to 50 carbon atoms, such as propyl glycidyl ether, butyl glycidyl ether and phenyl glycidyl ether. Examples of suitable glycidyl esters include, glycidyl neopentanoate and glycidyl neodecanoate, commercially available from the Shell Chemical Company as CARDURA E. After formation of the polymer, the carboxylic acid groups of the (meth) acrylic acid monomer units within the polymer backbone can be reacted with an oxirane functional compound, such as a glycidyl ether and/or glycidyl ester.

The cationic salt groups of the cationic organic polymer can be amine salt groups, which can be formed from the reaction of an epoxide functional polymer, such as an epoxide functional acrylic polymer with a compound containing a primary or secondary amine group, such as methylamine, diethanolamine, ammonia, diisopropanolamine, N-methyl ethanolamine, diethylenetriamine, dipropylenetriamine, bishexamethylenetriamine, the diketimine of diethylenetriamine, the diketimine of dipropylenetriamine, the diketimine of bishexamethylenetriamine and mixtures thereof. The amine groups can be at least partially neutralized with an acid. Suitable acids include organic and inorganic acids such as formic acid, acetic acid, lactic acid, phosphoric acid, dimethylolpropionic acid and sulfamic acid. Mixtures of acids can be used. The resin can contain primary, secondary and/or tertiary amino groups. Suitable cationic acrylic polymers containing amino groups include those polymers described in U.S. Pat. Nos. 3,455,806 and 3,928,157 and U.S. Publication No. 2003/0054193. Alternatively, amine salt groups can be introduced directly, typically during polymerization, by preparing the cationic organic polymer from one or more amino group-containing monomers, such as an aminoalkyl(meth)acrylate, for example dimethylaminopropyl methacrylate.

Sulfonium salt groups can be introduced into an organic polymer having epoxide functionality, by reacting the epoxide functional polymer with a sulfide in the presence of an acid. Sulfides that can be used to prepare cationic organic polymers having sulfonium groups can be aliphatic, mixed aliphatic-aromatic, aralkyl or cyclic sulfides. Examples of such sulfides include, but are not limited to, diethyl sulfide, dipropyl sulfide, dibutyl sulfide, diphenyl sulfide, dihexyl sulfide, ethylphenyl sulfide, tetramethylene sulfide, pentamethylene sulfide, thiodiethanol, thiodipropanol, and thiodibutanol. With some embodiments, the sulfide can be represented by the following structure, $R^5$—S—$R^6$, with $R^5$ and $R^6$ are each independently alkyl or hydroxyalkyl containing from 2 to 12 carbon atoms. With further embodiments, the sulfide used is thiodiethanol, in which $R^5$ and $R^6$ are each hydroxyalkyl containing 2 carbon atoms. The acid used to form the sulfonium salt, which can be described as a ternary sulfonium salt, can be selected from a wide range of acids, provided they result in the formation of sulfonium groups, such as organic acids and/or inorganic acids. With some embodiments, the acid is selected from one or more organic carboxylic acids. Examples of acids which can be used to form the sulfonium groups include, but are not limited to, boric acid, formic acid, lactic acid, acetic acid, propionic acid, butyric acid, dimethylolpropionic acid, hydrochloric acid, phosphoric acid and sulfuric acid. With some further embodiments dimethylolpropionic is used to form the sulfonium groups. The introduction of sulfonium salt groups into the cationic organic polymer is described in, for example, U.S. Pat. Nos. 3,959,106 and 4,715,898, the disclosures thereof are each incorporated herein by reference.

Examples of epoxy functional monomers, which after formation of the polymer, can be reacted to form amine salt groups or sulfonium salt groups, include, for example, glycidyl acrylate, glycidyl methacrylate, 3,4-epoxycyclohexylmethyl(meth)acrylate, 2-(3,4-epoxycyclohexylmethyl)(meth)acrylate, and allyl glycidyl ether.

The cationically electrodeposited outer organic polymer coating composition, in addition to (a) a cationic organic polymer, also includes (b) a curing agent having at least two functional groups which are reactive with the functional groups of the cationic organic polymer (a). With some embodiments, the cationic organic polymer has active hydrogen groups, and as such, the curing agent has at least two functional groups which are reactive with the active hydrogen groups of the cationic organic polymer.

Examples of suitable curing agents having functional groups that are reactive with active hydrogen groups, include epoxide functional during agents, polyisocyanate curing agents, and aminoplast curing agents. Curing agents that can be used in the cationically electrodeposited outer organic polymer coating composition include blocked organic polyisocyanates. The polyisocyanates can be fully blocked as described in U.S. Pat. No. 3,984,299 column 1 lines 1 to 68, column 2 and column 3 lines 1 to 15, or partially blocked and reacted with the polymer backbone as described in U.S. Pat. No. 3,947,338 column 2 lines 65 to 68, column 3 and column 4 lines 1 to 30, which are incorporated by reference herein. By "blocked" is meant that the isocyanate groups (the —NCO groups) have been reacted with a compound so that the resultant blocked isocyanate group is stable in the presence of (or uncreative with) active hydrogen groups at ambient temperature, but reactive with active hydrogen groups in the film forming cationic organic polymer at elevated temperatures, such as from 90° C. to 200° C.

Examples of polyisocyanates include aromatic and aliphatic polyisocyanates, including cycloaliphatic polyisocyanates and representative examples include diphenylmethane-4,4'-diisocyanate (MDI), 2,4- or 2,6-toluene diisocyanate (TDI), including mixtures thereof, p-phenylene diisocyanate, tetramethylene and hexamethylene diisocyanates, dicyclohexylmethane-4,4'-diisocyanate, isophorone diisocyanate, mixtures of phenylmethane-4,4'-diisocyanate and polymethylene polyphenylisocyanate. Higher polyisocyanates such as triisocyanates can be used, such as triphenylmethane-4,4',4"-triisocyanate.

The polyisocyanate curing agent (b) can be utilized in conjunction with the active hydrogen group-containing cationic organic polymer (a) in an amount of at least 1 percent by weight, or at least 15 percent by weight, or at least 25 percent by weight, based on total solids weight of (a) and (b). Also, the polyisocyanate curing agent can be used in conjunction with the active hydrogen group-containing cationic organic polymer in an amount of less than 50 percent by weight, or less than 40 percent by weight, based on total solids weight of (a) and (b). The polyisocyanate curing agent can be present in the cationically electrodeposited (or electrodepositable) outer organic polymer coating composition in an amount ranging between any combination of these upper and lower values, inclusive of the recited values, such as from 1 to 50 percent by weight, or from 15 to 40 percent by weight, based on total solids weight of (a) and (b). Correspondingly, the cationic organic polymer can be present in an amount of at least 50 percent by weight, or 60 percent by weight, based on total solids weight of (a) and (b). The cationic organic polymer can also be present in an amount of less than or equal to 99 percent by weight, or less than or equal to 85 percent by weight, or less than or equal to 75 percent by weight, based on total solids weight of (a) and (b). The cationic organic polymer can be present in any combination of these upper and lower values, inclusive of the recited values, such as from 50 to 99 percent by weight, or from 60 to 85 percent by weight, based on total solids weight of (a) and (b).

As described previously, the cationically electrodeposited (or electrodepositable) outer organic polymer coating is typically electrodeposited from an aqueous electodeposition bath. The aqueous electrodeposition bath is typically in the form of an aqueous dispersion. Without intending to be bound by any theory, the aqueous dispersion is believed to be a two-phase transparent, translucent or opaque resinous system in which the resin is in the dispersed phase and the water is in (or forms) the continuous phase. The average particle size of the resinous phase is generally less than 1.0 micron, or less than 0.5 microns, or less than 0.15 microns.

The aqueous electrodeposition bath can be prepared, with some embodiments, by dispersing two separate components in an aqueous medium. In accordance with some embodiments, the aqueous electrodeposition bath can be prepared from: (1) a clear resin feed, which includes generally, the cationic organic polymer (which can be referred to as the main film-forming polymer), the curing agent, and any additional water-dispersible non-pigmented components; and (2) a pigment paste, which generally includes one or more pigments, a water-dispersible grind resin which can be the same or different from the main-film forming polymer, and, optional additives, such as wetting or dispersing aids. The electrodeposition bath components (1) and (2) are typically dispersed in an aqueous medium which includes water and optionally coalescing solvents. Alternatively, the aqueous electrodeposition bath can be prepared from a one-component system, which contains the main film-forming polymer, the curing agent, the pigment paste, and any optional additives in one package. The one-component system is dispersed in an aqueous medium as described above.

As described above the aqueous electrodeposition bath can include one or more coalescing solvents. Examples of coalescing solvents that can be present include, but are not limited to, hydrocarbons, alcohols, esters, ethers and ketones. Typically, the coalescing solvents can be selected from alcohols, polyols and/or ketones. More specific examples of coalescing solvents include, but are not limited to, isopropanol, butanol, 2-ethylhexanol, isophorone, 2-methoxypentanone, ethylene and propylene glycol, the monoethyl, monobutyl and monohexyl ethers of ethylene or propylene glycol, and combinations thereof. The amount of coalescing solvent present can be from 0.01 to 25 percent by weight, or from 0.05 to 5 percent by weight, based on total weight of the aqueous medium.

As discussed above, a pigment composition and various additives such as surfactants, wetting agents and/or catalyst can optionally be included in the aqueous electrodeposition bath or dispersion. The pigment composition can include pigments, such as, iron oxides, strontium chromate, carbon black, coal dust, titanium dioxide, talc, barium sulfate, as well as color pigments such as cadmium yellow, cadmium red, chromium yellow, and the like. The pigment composition can alternatively or additionally include one or more transition metals selected from those classes and examples as described previously herein with regard to the sacrificial cathodic layer, such as zinc flakes. The pigment content of the aqueous electrodeposition bath is typically expressed as a pigment-to-resin ratio. In accordance with some embodiments of the present invention, when pigment is present, the pigment-to-resin ratio is typically within the range of about 0.02 to 1:1. The other additives mentioned above can be present in the aqueous electrodeposition bath in amounts of from 0.01 to 3 percent by weight, based on weight of resin solids (i.e., solids weight of the cationic organic polymer and curing agent).

The outer organic polymer coating can be electrodeposited over or onto the electrically conductive sacrificial cathodic layer in accordance with art-recognized methods. With some embodiments, for example, the reflective article having as an outer layer an electrically conductive sacrificial cathodic layer, can be at least partially immersed in an aqueous electrodeposition bath as describe above, from which the outer organic polymer coating is cationically electrodeposited thereon. The applied voltage for electrodeposition can be, for example, as low as 1 volt to as high as several thousand volts, but is typically from 50 to 500 volts. The current density is usually between 0.5 ampere and 5 amperes per square foot, and typically decreases during electrodeposition indicating the formation of an insulating film.

After the outer organic polymer coating has been applied by electrodeposition, it is typically cured by exposure to elevated temperatures, such as from 90° C. to 260° C., for at least a sufficient period of time, such as from 1 minute to 40 minutes.

With some embodiments, the outer organic polymer coating can be electrodeposited over or onto the electrically conductive sacrificial cathodic layer in accordance with an electrodeposition curtain coating method, which can also be referred to herein as an electrocurtain coating process or method. The electrocurtain coating process typically involves, moving a first electrically conductive liquid material (e.g., in the form of a liquid curtain) over a first area of an upper or first surface of the sacrificial cathodic layer, and moving a second electrically conductive liquid material (e.g., in the form of a liquid curtain) over a second area of the upper/second surface of the sacrificial cathodic layer. One of the first and second electrically conductive liquid materials includes an electrodepositable coating composition, such as described previously herein. The electrocurtain coating method also involves, maintaining the first and second electrically conductive liquid materials spaced from one another, so as to provide a third area of the first surface between the first and second areas, which serves to establish a current path (e.g., a direct current path) through the first electrically conductive liquid material, the third area of the conductive surface and through the second electrically conductive liquid material. An electric current, such as a substantially direct electrical current, is moved (or passed) through the current path, which results in electrodeposition of the outer organic polymer coating over the area (e.g., the first or second area) of the first surface of the sacrificial cathodic layer that is contacted with the electrodepositable coating composition.

While one of the first and second electrically conductive liquid materials includes an electrodepositable coating composition, the other of the first and second electrically conductive liquid materials includes an electrically conductive liquid material that is typically not an electrodepositable coating composition. Examples of electrically conductive liquid materials that are not electrodepositable coating compositions include, but are not limited to, liquids having sufficient ion content so as to be electrically conductive, such as city or tap water, and/or permeate. As is recognized by skilled artisans, permeate is an electrically conductive liquid obtained from ultrafiltration treatment of electrodepositable coating compositions.

The first and second electrically conductive liquid materials can be spaced from each other by suitable methods. With some embodiments, the first and second electrically conductive liquid materials are maintained in spaced relationship relative to each other by one or more air knives interposed therebetween and arranged so as to impinge a stream of pressurized air on the third area of the upper/second surface of the sacrificial cathodic layer.

Two or more pairs of first and second electrically conductive liquid materials can be used to apply/electrodeposit the outer organic polymer coating over the sacrificial cathodic layer. Each pair of first and second electrically conductive liquid materials typically has one or more air knives interposed therebetween, as described previously herein.

The electrocurtain coating process by which the outer organic polymer coating can be applied/electrodeposited over the sacrificial cathodic layer is described in further detail in U.S. patent application Ser. No. 12/911,189, filed Oct. 25, 2010, the disclosure of which is incorporated herein by reference in its entirety.

Figure 5:
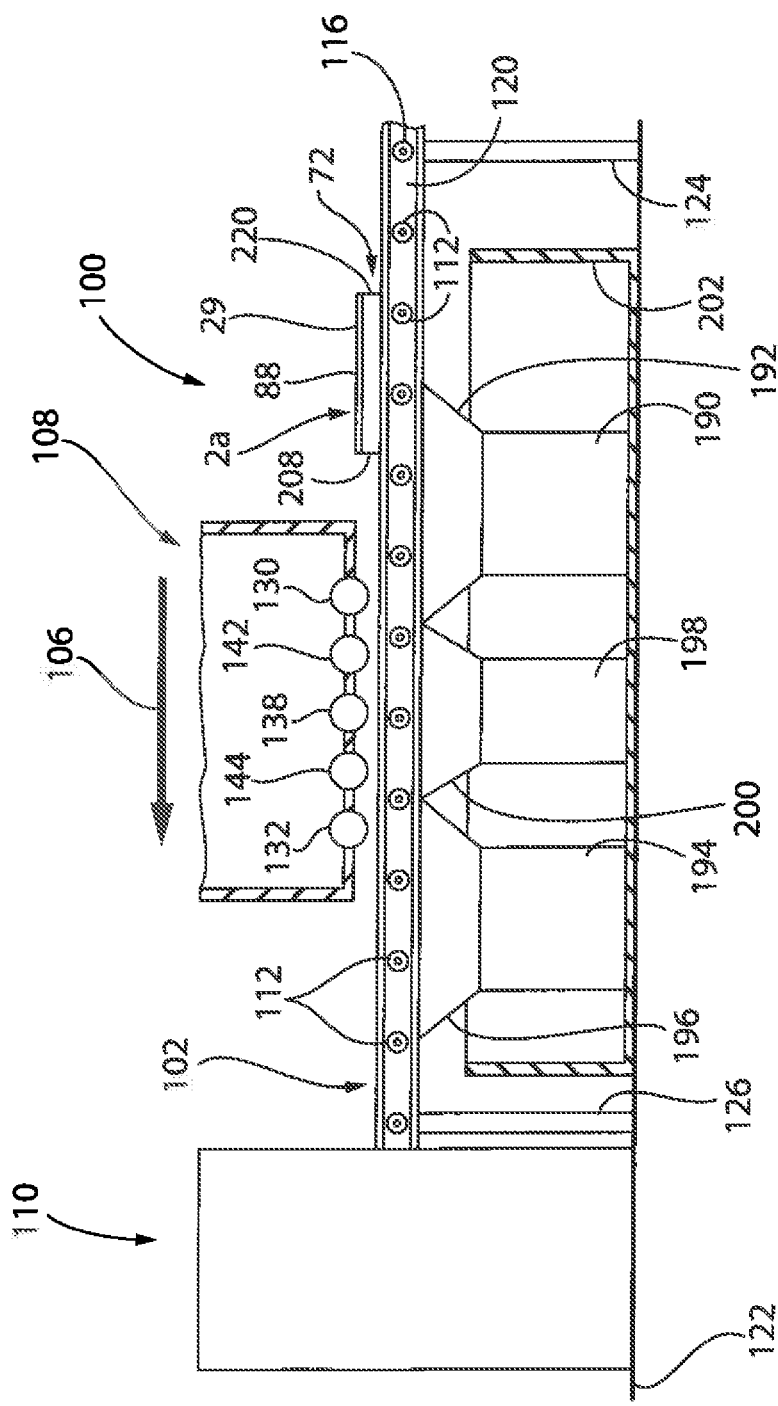
FIG. 5 is a representative side elevational view of a curtain coating station that can be used to apply the outer polymer coating by electrodeposition over the sacrificial cathodic layer.
Figure 6:
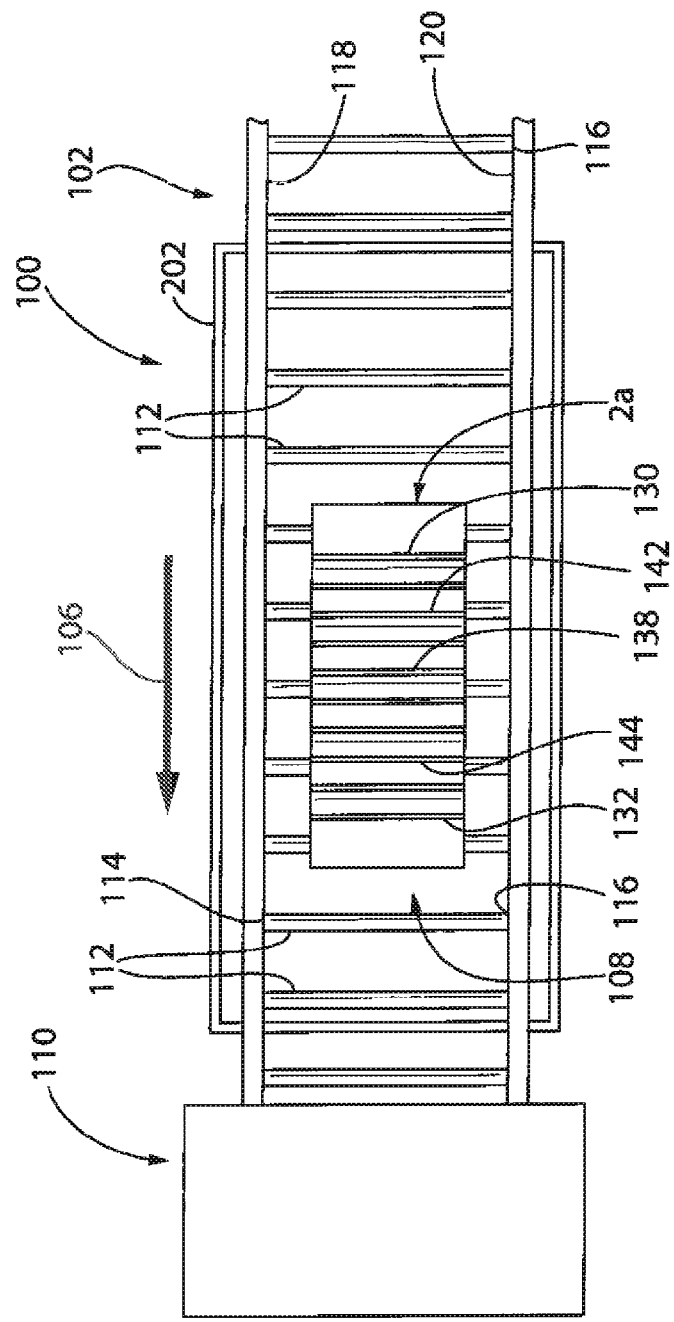
FIG. 6 is a representative top plan view of the coating station of FIG. 5.

For purposes of nonlimiting illustration, the electrocurtain coating process will be described in further detail with reference to FIGS. 5-9. With reference to FIGS. 5 and 6, a coating station 100 is depicted, which can be used to apply the outer organic polymer coating 32 on or over the electrically conductive surface 88 of the sacrificial cathodic layer 29. Coating station 100 includes a conveyor 102 for moving reflective article 2a, having the sacrificial cathodic layer 29, in the direction of arrow 106 under an electric flow coating arrangement 108. Electric flow coating arrangement 108 is positioned above conveyor 102. After passing under electric flow coating arrangement 108, the electrocoated reflective article 2a is then forwarded into curing station 110. Reflective article 2 (e.g., as described previously herein with reference to FIG. 1) is removed from curing station 110 (not depicted in FIGS. 5 and 6).

Conveyor 102 includes a plurality of plastic conveyor rollers 112 having opposed ends 114 and 116 mounted on horizontal beams 118 and 120, respectively and connected to an art-recognized gearing arrangement powered by a motor (not shown), so as to move reflective article 2a in the direction of the arrow 106. The horizontal beams 118 and 120 are supported above floor 122 (numbered only in FIG. 5) by vertical struts 124 and 126 (shown only in FIG. 5).

Electric flow coating arrangement 108 includes curtain flow conduits 130 and 132 connected to a terminal 134 of a direct current rectifier, such as negative terminal 134 of direct current rectifier 136 (e.g., a 500 volt DC rectifier). Electric flow coating arrangement 108 also includes curtain flow conduit 138, which is connected to an opposite terminal 140 (e.g., the positive terminal 140 of rectifier 136). See FIG. 7. Alternatively, curtain flow conduits 130 and 132 can both be electrically connected to positive terminal 140 of rectifier 136, and curtain flow conduit 138 can be electrically connected to negative terminal 134 of rectifier 136.

With some embodiments, the electrodepositable protective coating composition is moved or passed through the middle conduit (e.g., conduit 138) for reasons including, but not limited to, efficient collection and re-use of the electrodepositable coating composition as described in further detail below. Alternatively, the electrodepositable coating composition can be moved or passed through the outer conduits (e.g., conduits 130 and 132). With the electrical arrangement depicted in FIG. 7, a cationic electrodepositable coating composition is moved or passed through conduit 138. With some alternative embodiments, curtain flow conduits 130 and 132 are electrically connected to positive terminal 140 of rectifier 136, and curtain flow conduit 138 is electrically connected to negative terminal 134 of rectifier 136, in which case an anionic electrodeposition coating composition can be passed through conduit 138, while one or more electrically conductive non-coating compositions is passed through conduits 130 and 132.

Curtain flow conduits 130 and 138 can be described as together forming a first pair of curtain flow conduits, and curtain flow conduits 138 and 132 can be described as together forming a second pair of curtain flow conduits. The first pair (130 and 138) and the second pair (138 and 132) of curtain flow conduits each serve to electrodeposit the outer organic polymer coating 32 onto or over the sacrificial cathodic layer 29.

A conduit 142 that provides a first air knife is positioned between curtain flow conduits 130 and 138, and a conduit 144 for providing a second air knife is positioned between curtain flow conduits 132 and 138. The first air knife provided by conduit 142 maintains the fluids from flow curtain conduits 130 and 138 on the conductive surface 88 spaced from and free of contact with each other. The second air knife provided by conduit 144 maintains the fluids from flow curtain conduits 132 and 138 on the conductive surface 88 spaced from and free of contact with each other.

The curtain flow conduits (e.g., 130, 132, and 138) can be in the form of elongated tubes having closed ends, an internal chamber, and a plurality of appropriately sized apertures, such as aligned apertures (or one elongated aperture), that are in fluid communication with the internal chamber and positioned in facing opposition relative to conveyor 102 and the upper surface (e.g., surface 88) of reflective article 2a. The air knife conduits (e.g., 144 and 142) can be similarly configured as the curtain flow conduits. The conduits (e.g., 130, 132, 138, 142, and 144) are typically aligned substantially parallel to each other relative to their longitudinal axis.

The curtain flow conduits can be in fluid communication with common or separate reservoirs, depending, for example, on what fluid is being passed through each curtain flow conduit. With some embodiments and with reference to FIG. 8, conduits 130 and 132 are connected by tubing 154 and 156, respectively, to supply tank (or reservoir) 158, which contains a conductive liquid capable of carrying an anodic charge from the rectifier 136 (see FIG. 6). Hereinafter the liquid capable of carrying an anodic charge (e.g. an anion containing liquid) can also be referred to as "an anionic liquid." Alternatively, conduits 130 and 132 can each be connected to a separate supply tank as discussed below. Conduit 138 is connected by tubing 160 to a supply tank 162, which contains a conductive liquid capable of carrying a cationic charge (e.g., a cationic electrodeposition coating composition) from rectifier 136. Hereinafter, the liquid capable of carrying a cationic charge (e.g. a cationic containing liquid) can also be referred to as "a cationic liquid." Each of the tubings 154, 156 and 160 have a valve and/or pump 164 to control the flow of the liquid into the related curtain flow conduit, so as to maintain a substantially continuous flow curtain therefrom.

Conduits 142 and 144 are connected by tubing 166 and 168 respectively to a pressurized air supply 170 to provide an air knife or air curtain on the conductive surface 88 of the sacrificial cathodic layer 29. A flow valve and/or pump 172 is provided on (or in line with) each of tubing 166 and 168 to provide an air curtain of sufficient pressure to maintain the electrically conductive liquids on the conductive surface 88 spaced from and substantially free of contact with each another.

Figure 7:
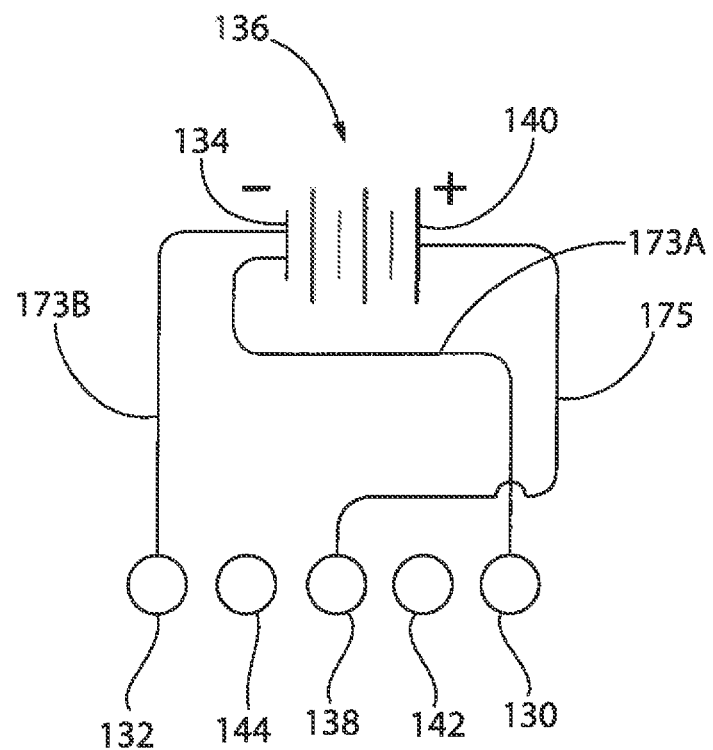
FIG. 7 is a representative schematic of an electrical system that can be used with the coating station of FIG. 5.
Figure 8:
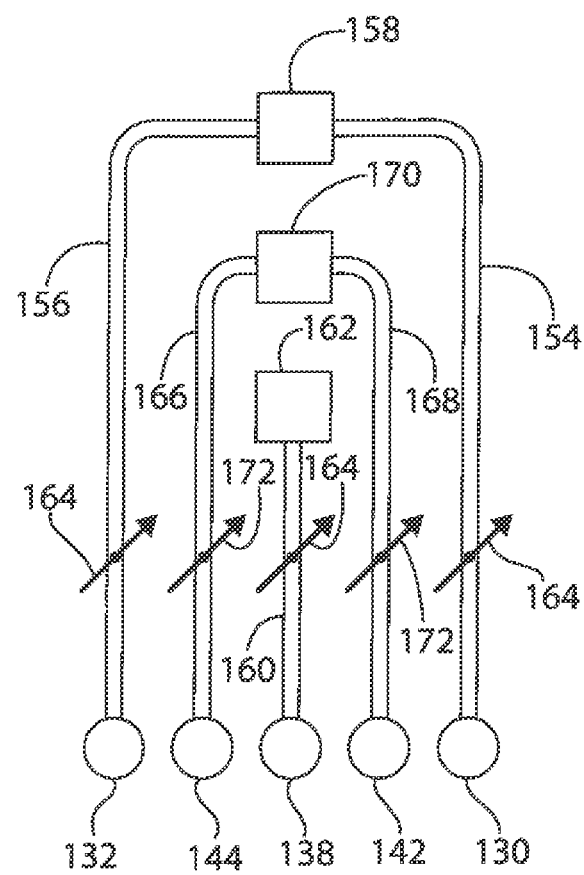
FIG. 8 is a representative schematic of a fluid supply system that can be used with the coating station of FIG. 5.

With reference to FIGS. 7 and 9, a first electrical circuit is provided from rectifier 136 to conduit 130 by way of the wire 173A, through the electric flow curtain 210 of conduit 130, through conductive surface 88 of sacrificial cathodic layer 29 of reflective article 2a, through electric flow curtain 214 of conduit 138, and through conduit 138 to rectifier 136 by way of wire 175. A second electrical circuit is provided from rectifier 136 to conduit 132 by way of wire 173B, through the electric flow curtain 218 of conduit 132, through conductive surface 88 of sacrificial cathodic layer 29 of reflective article 2a, through the electric flow curtain 214 of conduit 138, and through conduit 138 to rectifier 136 by way of the wire 175.

With reference to FIG. 5, a first polypropylene tank 190 having a sloping collar or opening 192 is positioned under conveyor rolls 112 of conveyor 102. Opening 192 of tank 190 typically has a length that extends from a position upstream of conduit 130 of coating arrangement 108 to a position that is typically downstream of conduit 130 and upstream of air conduit 142, and a width about equal to the spacing of the horizontal beams 118 and 120 of conveyor 102, so as to collect anionic fluid from the conduit 130 that flows off of conductive surface 88. A second polypropylene tank 194 having a sloping collar or opening 196 is positioned under conveyor rolls 112 of conveyor 102. Opening 196 of tank 194 typically has a length that extends from a position downstream of conduit 132 of coating arrangement 108 to a position typically upstream of conduit 132 and downstream air conduit 144, and a width about equal to the spacing of the horizontal beams 118 and 120 of conveyor 102, so as to collect anionic fluid from conduit 132 that flows off of conductive surface 88. A third polypropylene tank 198 having a sloping collar or opening 200 is positioned under conveyor rolls 112 of conveyor 102 and between tanks 190 and 196. Opening 200 of third tank 198 typically has a length that extends from collar 192 of first tank 190 to collar 196 of second tank 194, and a width about equal to the spacing of the horizontal beams 118 and 120 of the conveyor 102, so as to collect cationic fluid (e.g., cationic electrodeposition coating composition) from conduit 138 that flows off of conductive surface 88 (e.g., which does not adhere to, or is not electrodeposited onto conductive surface 88). With some embodiments, opening 200 of third tank resides below air knife conduits 142 and 144, and curtain flow conduit 138. Typically, tanks 190, 196 and 198 reside in a larger container, such as polypropylene container 202, to collect fluids that are not contained in tanks 190, 194 and 198.

For purposes of further illustration, and with reference to FIGS. 5-9, tank 198 collects a cationic electrocoating composition, such as POWERCRON® 935 cationic acrylic electrocoating composition (available from PPG Industries, Inc., Pittsburgh, Pa., USA), and tanks 190 and 194 each collect a liquid of sufficient electrical conductivity (e.g., 450 μS), such as tap water and/or permeate. The reflective article 2a is placed on conveyor rolls 112 with the conductive surface 88 facing the coating arrangement 108. The conveyor 102 is powered to move reflective article 2a in the direction of the arrow 106 toward the coating arrangement 108. With particular reference to FIGS. 9A-9G, as the leading edge 208 of reflective article 2a moves toward conduit 130, valve or pump 164 of conduit 130 is activated to allow anionic fluid to flow through apertures (not shown) of conduit 130 so as to form a flow curtain 210 of anionic fluid (see FIG. 9A) that moves toward the conveyor 102 and conductive surface 88. As the reflective article 2a continues to move in the direction of arrow 106, toward air conduit 142, valve or pump 172 of air conduit 142 is activated to allow an air curtain 212 to be directed toward conveyor 102 and surface 88. As the leading edge 208 of reflective article 2a moves under air curtain 212 (see FIG. 9B), air curtain 212 moves the anionic fluid over conductive surface 88 in an upstream direction over conductive surface 88 of sacrificial cathodic layer 29 of reflective article 2a. Reflective article 2a continues to move in the direction of arrow 106, and leading edge 208 of reflective article 2a moves toward conduit 138, activating valve or pump 164 of conduit 138 thereby allowing cationic fluid to pass from openings (not shown) of conduit 138 to form a curtain 214 of cationic fluid toward conveyor 102 and surface 88. As reflective article 2a moves under cationic flow curtain 214 from conduit 138 (see FIG. 9C), air curtain 212 moves the anionic fluid on the conductive surface 88 of reflective article 2a in an upstream direction and the cationic fluid in a downstream direction so as to maintain the anionic fluid and the cationic fluid on the conductive surface 88 spaced from and free of contact (e.g. electrical contact) with each other, thereby providing a first electrically conductive circuit that results in the outer organic layer 32 being electrodeposited from the cationic fluid onto a portion of the conductive surface 88 of sacrificial cathodic layer 29 of reflective article 2a.

Leading edge 208 of reflective article 2a continues to move in the direction of arrow 106 toward air conduit 144 as valve or pump 172 is opened or activated, allowing an air knife or curtain 216 to be directed toward conveyor 102 and surface 88. As leading edge 208 of reflective article 2a moves under air curtain 216, the cationic fluid is moved in an upstream direction (see FIG. 9D) over conductive surface 88. Continued movement of reflective article 2a moves leading edge 208 toward conduit 132 as valve or pump 164 of conduit 132 is opened or activated, allowing anionic fluid to pass through openings (not shown) of conduit 132 so as to provide anionic flow curtain 218 (see FIG. 9E). Air knife 216 moves the cationic fluid from conduit 138 over conductive surface 88 in an upstream direction and the anionic fluid from conduit 132 in a downstream direction so as to maintain the anionic fluid and the cationic fluid on the conductive surface 88 spaced from and free of contact with each other, thereby providing a second electrically conductive circuit that results in the outer organic layer 32 being electrodeposited from the cationic fluid onto a portion of the conductive surface 88 of sacrificial cathodic layer 29 of reflective article 2a. As leading edge 208 of reflective article 2a moves through anionic flow curtain 218 of conduit 132, the trailing edge 220 of reflective article 2a moves downstream of conduit 130 shorting out the first electrical circuit (see FIG. 9E) and away from air conduit 142 (see FIG. 9F). The valve or pump 164 of conduit 130 and the valve or pump 172 of conduit 142 are closed or turned off, respectively (see FIG. 8).

Figure 9A:
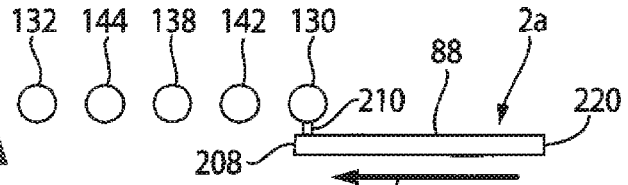
FIG. 9, which includes FIGS. 9A through 9G, provides a sequential series of representative side elevational views of steps by which the outer polymer coating can be applied by electrodeposition over the sacrificial cathodic layer, using the coating station of FIG. 5.
Figure 9B:
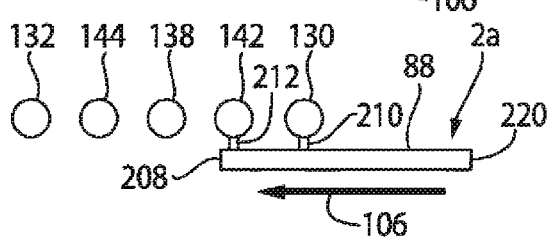
Figure 9C:
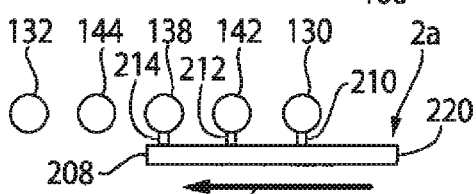
Figure 9D:
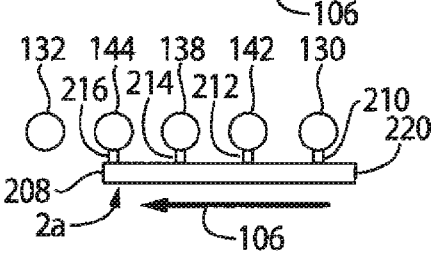
Figure 9E:
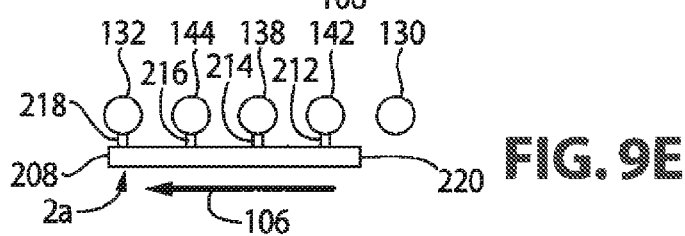
Figure 9F:
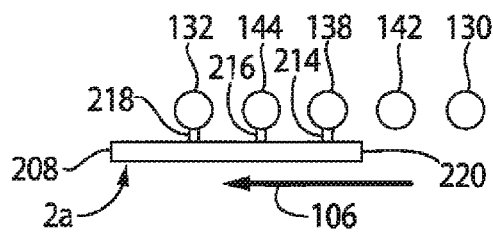
Figure 9G:
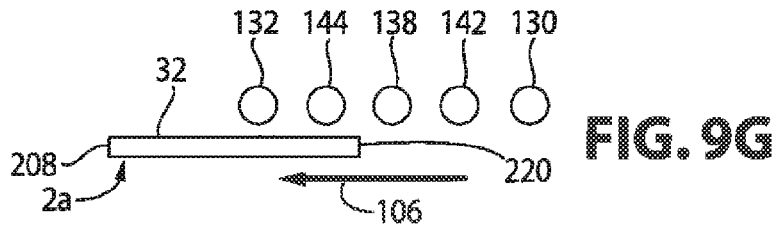

As trailing edge 220 of reflective article 2a having outer organic polymer coating 32 electrodeposited thereon moves past conduit 138, the second electrical circuit is shorted out, and the valve or pump 164 of conduit 138, the valve or pump 172 of conduit 144 and the valve or pump 164 of conduit 132 are closed or turned off, respectively (see FIG. 9G). Reflective article 2a is moved on conveyor 102 into curing station 110 (see FIG. 5). Reflective article 2 (e.g., as represented by FIG. 1) is then removed from curing station 110.

The valves and/or pumps (e.g., 164 and/or 172) can in each case be activated (or deactivated) by art-recognized sensing equipment and methods. With some alternative embodiments, the anionic fluid can be passed through conduit 138 and the cationic fluid can be passed through conduits 130 and 132.

In accordance with some embodiments of the present invention, the outer organic polymer coating includes a transition metal, which can be independently selected from those classes and examples of transition metals described previously herein with regard to the sacrificial cathodic layer. The transition metal of the outer organic polymer coating can be selected from, for example, zinc, aluminum, copper, magnesium, and mixtures, alloys, or combinations of two or more thereof. The transition metal of the outer organic polymer coating can be a particulate transition metal having one or more shapes or forms as described previously herein with regard to the sacrificial cathodic layer, such as a form of flakes. The transition metal of the outer organic polymer coating, according to some further embodiments, can be selected from zinc, organo-zinc compounds, and combinations thereof. The organo group or groups of the organo-zinc compounds can each independently be selected from one or more hydrocarbyl and substituted hydrocarbyl groups. With some embodiments, the outer organic polymer coating includes a transition metal, such as zinc flakes, in an amount of from 10 to 80 percent by weight, or from 25 to 60 percent by weight, or from 30 to 55 percent by weight, based on the total solids weight of the outer organic polymer coating.

The sacrificial cathodic layer (e.g., 29 of FIG. 1), with some embodiments, can include an organic polymer matrix. According to some embodiments, the sacrificial cathodic layer includes an organic polymer matrix, and is free of an inorganic matrix, such as an inorganic matrix formed from at least one organo-titanate. In addition to including an organic polymer matrix, the sacrificial cathodic layer can also include the transition metal in the form of a particulate transition metal. The particulate transition metal is as described previously herein, and can be selected from those classes and examples as described previously herein, such as zinc flakes.

The organic polymer matrix of the sacrificial cathodic layer can include one or more organic polymers, such as polyester polymers, acrylic polymers, polycarbonate polymers, epoxy polymers, polyether polymers, polyurethane polymers, and combinations of two or more thereof.

When the sacrificial cathodic layer includes particulate transition metal, and an organic polymer matrix, the transition metal can be present in an amount of at least 20 percent by weight, and less than 100 percent by weight, such as from 20 to 90 percent by weight, or from 55 to 85 percent by weight, or from 60 to 80 percent by weight, based on the total weight of solids of the composition from which the organic polymer matrix is formed, or the total weight of the resulting sacrificial cathodic layer. Correspondingly, the organic polymer can be present in an amount of greater than 0 percent by weight, and less than or equal to 80 percent by weight, such as from 10 to 80 percent by weight, or from 15 to 45 percent by weight, or from 20 to 40 percent by weight, based on the total weight of solids of the composition from which the organic polymer matrix is formed, or the total weight of the resulting sacrificial cathodic layer.

The organic polymer matrix of the sacrificial cathodic layer can be a thermoplastic organic polymer matrix, a crosslinked organic polymer matrix, or a combination thereof. Typically, the organic polymer matrix of the sacrificial cathodic layer is a crosslinked organic polymer matrix. When including an organic polymer matrix, the sacrificial cathodic layer can optionally include one or more additives, such as, but not limited to, ultraviolet light stabilizers, thermal stabilizers, flow control agents, dyes, pigments, such as inorganic and/or organic pigments, reinforcing agents, such as inorganic and/or organic fibers, and combinations thereof. Such additives can be present in the sacrificial cathodic layer (when it includes an organic polymer matrix) in appropriate art-recognized amounts, such as from 0.1 to 60 percent by weight, or from 0.5 to 10 percent by weight, based on total solids weight of the outer sacrificial cathodic layer.

With some embodiments of the present invention, the organic coating composition from which the sacrificial cathodic layer is formed, can optionally further include one or moisture scavengers. The moisture scavengers can be selected from art-recognized materials, such as, but not limited to, microporous aluminosilicate materials, silanes, and combinations thereof. Examples of microporous aluminosilicate materials include, but are not limited to, zeolites. Examples of silanes include, but are not limited to, oxirane functional silanes, such as glycidoxyalkyltrialkoxysilanes. An example of an oxirane functional silane is gamma-glycidoxypropyltrimethoxysilane. The moisture scavenger can be present in the organic coating composition from which the sacrificial cathodic layer is formed in a suitable amount, such as less than or equal to 10 percent, or less than or equal to 5 percent by weight, based on total weight of the inorganic coating composition. With some embodiments, the moisture scavenger includes at least one microporous aluminosilicate material, such as one or more zeolites, and one or more oxirane functional silanes, such as gamma-glycidoxypropyltrimethoxysilane, each being present in an amount of 1 percent by weight, based on total weight of the organic coating composition.

With some embodiments, when the sacrificial cathodic layer includes particulate transition metal and an organic polymer matrix, the sacrificial cathodic layer can be electrically conductive. By "electrically conductive" means the sacrificial cathodic layer has an electrical conductivity at least sufficient so as to allow the electrodeposition of another coating layer directly thereon/thereover. The sacrificial cathodic layer can, for example, have an electrical resistivity of less than or equal to 5 megaohms/cm$^2$, such as from 0.5 to 5 megaohms/cm$^2$, inclusive of the recited values.

Increasing the amount of particulate transition metal present in the sacrificial cathodic layer, can result in the sacrificial cathodic layer being electrically conductive. With some embodiments, the particulate transition metal is present in an amount of at least 50 percent by weight, for example, from 50 to 90 percent by weight, or from 55 to 90 percent by weight, based total weight of the sacrificial cathodic layer, and the sacrificial cathodic layer is electrically conductive.

According to some embodiments, when the sacrificial cathodic layer includes particulate transition metal and an organic polymer matrix, and the sacrificial cathodic layer is electrically conductive, the outer organic polymer coating and the sacrificial cathodic layer abut each other, and the outer organic polymer coating is a cationically electrodeposited organic polymer coating. The outer organic polymer coating can be cationically electrodeposited onto the sacrificial cathodic layer in accordance with the methods described previously herein, such as by electrocurtain coating methods. The cationically electrodeposited organic polymer coating can include one or more polymers as described previously herein, such as an acrylic polymer.

In accordance with further embodiments, when the sacrificial cathodic layer includes particulate transition metal and an organic polymer matrix: the organic polymer matrix of the sacrificial cathodic layer is crosslinked; the organic polymer matrix is formed from a composition that includes a polymer, and in particular an organic polymer, and an aminoplast crosslinker (or crosslinking agent); and the outer organic polymer coating is formed from an outer organic polymer coating composition that includes a polymer, and in particular an organic polymer, and an aminoplast crosslinker. In further accordance with such embodiments, the outer organic polymer coating, in addition to being free of lead, is also substantially free of transition metal, and in particular is free of the transition metal(s) of said sacrificial cathodic layer. With some embodiments, the outer organic polymer coating, in addition to being free of lead, is also substantially free of any transition metal(s) from which the transition metal of the sacrificial cathodic layer can be selected.

The polymer of the organic polymer matrix of the sacrificial cathodic layer and the polymer of the outer organic polymer coating can each be independently selected from those classes and examples of polymers described previously herein. With some embodiments, the polymer of the organic polymer matrix of the sacrificial cathodic layer and the polymer of the outer organic polymer coating each include functional groups, such as active hydrogen groups that are reactive, and in particular are capable of condensing with the aminoplast crosslinker. Examples of active hydrogen groups include, but are not limited to, hydroxyl groups, thiol groups, primary amine groups, secondary amine groups, and combinations thereof. Typically, the polymer of the organic polymer matrix of the sacrificial cathodic layer and the polymer of the outer organic polymer coating each have functional groups selected from hydroxyl groups. The polymer of the organic polymer matrix of the sacrificial cathodic layer and the polymer of the outer organic polymer coating, with some embodiments, are each selected from polyester polymers having hydroxyl groups.

The aminoplast crosslinker of, the composition from which the organic polymer matrix of the sacrificial cathodic coating layer is formed, and the outer organic polymer coating composition from which the outer organic polymer coating is formed, can in each case be independently selected from art-recognized aminoplast crosslinkers. Examples of suitable aminoplast crosslinking agents include, but are not limited to, aminoplasts containing methylol and/or methylol ether groups.

Aminoplasts are typically obtained from the reaction of formaldehyde with an amine or amide. Examples of amines or amides include, but are not limited to, melamine, urea, and/or benzoguanamine. Condensates with other amines or amides can also be used, such as, aldehyde condensates of glycoluril, which give a high melting crystalline product which is useful in powder coatings. While formaldehyde is typically used to prepare aminoplasts crosslinking agents, other aldehydes can be used, such as acetaldehyde, crotonaldehyde, and/or benzaldehyde.

The aminoplast crosslinking agents typically contain methylol groups. At least a portion of these methylol groups are typically etherified with an alcohol to modify the cure response. Any monohydric alcohol may be employed for this purpose, examples of which include, but are not limited to, methanol, ethanol, butanol, isobutanol, and/or hexanol. With some embodiments, the aminoplast crosslinking agents are selected from melamine-, urea-, and/or benzoguanamine-formaldehyde condensates etherified with an alcohol containing from one to four carbon atoms.

The coating compositions from which, the organic polymer matrix of the sacrificial cathodic layer, and the outer organic polymer coating are prepared, typically include one or more catalysts to accelerate the cure of the aminoplast crosslinking agent with the reactive groups of the polymer(s). Suitable catalysts for aminoplast cure include, but are not limited to, acids such as acid phosphates and sulfonic acids or substituted sulfonic acids. Examples include dodecylbenzene sulfonic acid, paratoluene sulfonic acid, phenyl acid phosphate, ethylhexyl acid phosphate, and the like. The catalyst is typically present in an amount of about 0.05 to about 5.0 percent by weight, or about 0.25 to about 2.0 percent by weight, based on the total weight of resin solids in the coating composition.

The coating compositions containing aminoplast crosslinking agents are typically cured (or crosslinked) at elevated temperatures, such as from 100° C. to 218° C., or from 138° C. to 178° C., for an appropriate amount of time, such as from 1 minute to 8 hours, or from 15 to 45 minutes.

In accordance with embodiments of the invention, the transparent substrate (e.g., 11 of FIG. 1) of the reflective article can include any desired material having any desired characteristics. For example, the transparent substrate can be transparent to visible light. By "transparent" with regard to the substrate is meant having a transmission of greater than 0% up to 100% in a desired wavelength range, such as visible light. Alternatively, the transparent substrate can be at least partially translucent. By "translucent" with regard to the substrate is meant allowing electromagnetic radiation (e.g., visible light) to be transmitted but diffusing or scattering this radiation. Examples of suitable materials from which the transparent substrate can be selected include, but are not limited to, thermoplastic, thermoset, or elastomeric polymeric materials, glasses, ceramics, and metals or metal alloys, and combinations, composites, or mixtures thereof. Specific examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); ceramic substrates; glass substrates; or mixtures or combinations of any of the above.

With some embodiments, the transparent substrate can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered, bent, heat strengthened, or laminated. The glass can be of any type, such as conventional float glass, and can be of any composition having any optical properties, e.g., any value of visible transmission, ultraviolet transmission, infrared transmission, and/or total solar energy transmission. The transparent substrate can be selected from, for example, clear float glass or can be tinted or colored glass. Although not limiting to the invention, examples of glass suitable for the transparent substrate are described in U.S. Pat. Nos. 4,746,347; 4,792,536; 5,030,593; 5,030,594; 5,240,886; 5,385,872; and 5,393,593. The ply 12 can be of any desired dimensions, e.g., length, width, shape, or thickness. In one exemplary embodiment, the first ply 12 can be greater than 0 up to 10 mm thick, such as 1 mm to 10 mm thick, e.g., 1 mm to 5 mm thick, e.g., less than 4 mm thick, e.g., 3 mm to 3.5 mm thick, e.g., 3.2 mm thick. Additionally, the transparent substrate can be of any desired shape, such as flat, curved, parabolic-shaped, or the like. Also, when the primary reflective layer(s) 23 reside on the second major surface 17 of the reflective article, the transparent substrate can include one or more materials that exhibit low absorption of electromagnetic radiation in the region(s) of electromagnetic radiation desired to be reflected.

With some embodiments, the transparent substrate can have a high visible light transmission at a reference wavelength of 550 nanometers (nm) and a reference thickness of 3.2 mm. By "high visible light transmission" is meant visible light transmission at 550 nm of greater than or equal to 85%, such as greater than or equal to 87%, such as greater than or equal to 90%, such as greater than or equal to 91%, such as greater than or equal to 92%, such as greater than or equal to 93%, such as greater than or equal to 95%, at 3.2 mm reference thickness for the transparent substrate. More particular examples of glass from which the transparent ply can be selected include, but are not limited to, those disclosed in U.S. Pat. Nos. 5,030,593 and 5,030,594. Non-limiting examples of glass from which the transparent substrate can be selected include, but are not limited to, Starphire®, Solarphire®, Solarphire® PV, Solargreen®, Solextra®, GL-20®, GL-35™, Solarbronze®, CLEAR, and Solargray® glass, all commercially available from PPG Industries Inc. of Pittsburgh, Pa.

The basecoat (e.g., 20 of FIG. 1) of the reflective article can provide a stronger or more durable interface between the transparent substrate (e.g., 11) and the primary reflective coating (e.g., 23). The basecoat can include one or more materials chosen such that the interface between the basecoat (e.g., 20) and the primary reflective coating (e.g., 23) is more mechanically, chemically, and/or environmentally stable than an interface between the transparent substrate and the primary reflective layer. Also, the basecoat can serve as a diffusion barrier to the elemental exchange between the transparent substrate and the primary reflective coating, such as the migration of sodium out of the glass substrate into the overlying coating(s), or the migration of metal (e.g., silver) from the primary reflective coating to or into the glass. Such elemental migrations ca occur as the result of subjecting the reflective article to elevated temperatures, as can occur during bending or heat strengthening processes. Additionally or alternatively, the basecoat can provide a smoother or more planar surface upon which to deposit an overlaying coating, such as the primary reflective coating (e.g., 23).

Examples of materials suitable for the basecoat (e.g., 23) include, but are not limited to, inorganic materials such as but not limited to transparent low absorption dielectrics, such as metal oxides, metal nitrides, metal oxynitrides, and mixtures, alloys, or combinations of two or more thereof. With some embodiments, the basecoat includes at least one oxide, nitride, or oxynitride of a metal selected from aluminum, titanium, zirconium, zinc, tin, and mixtures, alloys or combinations of two or more thereof. With some additional embodiments, the basecoat includes at least one metal oxide selected from alumina, titania, zirconia, zinc oxide, zinc stannate, tin oxide, and mixtures, alloys or combinations of two or more thereof. The basecoat can include one or more layers of silicon dioxide and/or silicon nitride. With some embodiments, the basecoat includes titania. The basecoat can have any composition or thickness so as to provide sufficient functionality to the article (e.g., mechanical, chemical, passivation, planarization, adhesion, diffusion barrier properties, environmental durability enhancement, optical enhancement). In accordance with some embodiments the basecoat has a thickness in the range of 0.1 nm to 5 nm, such as 0.1 nm to 3 nm, such as 0.5 nm to 3 nm, such as 1 nm to 3 nm, such as 0.5 nm to 2 nm, such as 1 nm to 2 nm, such as 1.5 nm to 2 nm, such as 1.8 nm.

The basecoat (e.g., 20) can, with some embodiments, include at least one metal oxide selected from alumina, titania, zirconia, zinc oxide, zinc stannate, tin oxide, or mixtures or combinations thereof, and has a thickness of from 1 nm to 3 nm.

The primary reflective coating (e.g., 23) is formed over at least a portion of the second major surface (e.g., 17), such as over at least a portion of the basecoat (e.g., 20) if present. The primary reflective coating includes one or more inorganic or organic dielectrics, metals, or semiconductors selected to reflect one or more portions of the electromagnetic spectrum, such as one or more portions in the range of electromagnetic solar radiation. With some embodiments, the primary reflective coating includes one or more radiation reflective metallic films or layers. Examples of suitable reflective metals include, but are not limited to, metallic platinum, iridium, osmium, palladium, aluminum, gold, copper, silver, mixtures of two or more thereof, alloys of two or more thereof, or combinations of two or more thereof.

The primary reflective coating (e.g., 23) can, with some embodiments, include a metallic silver layer having a thickness in the range of 50 nm to 500 nm, such as 50 nm to 300 nm, such as 60 nm to 400 nm, such as 60 nm to 300 nm, such as 70 nm to 300 nm, such as 80 nm to 200 nm, such as 80 nm to 150 nm, such as 90 nm to 150 nm, such as 90 nm to 140 nm, such as 90 nm to 130 nm, such as 100 nm to 130 nm, such as 120 nm to 130 nm. With some further embodiments, the primary reflective coating includes metallic silver and has a thickness of at least 50 nm, such as at least 60 nm, such as at least 70 nm, such as at least 80 nm (e.g., in the range of 70 nm to 90 nm). The primary reflective coating can be deposited to a thickness such that the reflective article of the present invention has any particular desired level of reflectance in the desired range of electromagnetic radiation to be reflected. The primary reflective coating can be deposited to a thickness sufficient such that the primary reflective coating is opaque in a desired wavelength range, such as visible light. The primary reflective coating can be particularly useful for reflecting visible and solar infrared energy. In accordance with some embodiments, the primary reflective coating is deposited by a conventional sputtering process, as described in more detail below. In other non-limiting embodiments, the primary reflective coating can include a "high reflector" that includes a plurality of alternating high and low refractive index materials.

The primary reflective coating, in accordance with some embodiments, is opaque to visible light and includes at least one metallic film, in which each metallic film independently includes a metal selected from platinum, iridium, osmium, palladium, aluminum, gold, copper, silver, or mixtures, alloys, or combinations thereof. Each metallic film, of the primary reflective coating, independently has a thickness in the range of 50 nm to 200 nm. The primary reflective coating, with some embodiments, includes two or more radiation reflective metallic films, such as a first metallic film including silver and a second metallic film including copper, which can abut each other or include one or more separate layers interposed there-between.

The inorganic protective coating (e.g., 26) assists in protecting the underlying layers, such as the primary reflective layer (e.g., 23) from mechanical and chemical attack during manufacture, transit, handling, processing, and/or during the mirrors service life in the field. The inorganic protective coating also helps protect the underlying layers from the ingress of liquid water, water vapor, and other environmental pollutants or contaminants, which can have a form selected from solids, liquids and/or gasses. The inorganic protective coating can be an oxygen barrier coating layer that prevents or reduces the passage of ambient oxygen into the underlying layers during subsequent processing, such as during heating or bending.

The inorganic protective coating can be fabricated from and/or include any desired material or mixture of materials, such as, but not limited to one or more inorganic materials. In accordance with some embodiments, the inorganic protective coating (e.g., 26) can include a layer having one or more metal oxide materials, such as, but not limited to oxides of aluminum, silicon, or mixtures thereof. For example, the inorganic protective coating can be a single coating layer including in the range of 0 wt. to 100 wt. % alumina and/or 100 wt. % to 0 wt. % silica, such as 1 wt. % to 99 wt. alumina and 99 wt. % to 1 wt. % silica, such as 5 wt. % to 95 wt. % alumina and 95 wt. to 5 wt. % silica, such as 10 wt. % to 90 wt. % alumina and 90 wt. % to 10 wt.

silica, such as 15 wt. % to 90 wt. % alumina and 85 wt. % to 10 wt. % silica, such as 50 wt. % to 75 wt. % alumina and 50 wt. % to 25 wt. % silica, such as 50 wt. % to 70 wt. alumina and 50 wt. % to 30 wt. % silica, such as 35 wt. % to 100 wt. % alumina and 65 wt. % to 0 wt. % silica, e.g., 70 wt. % to 90 wt. % alumina and 30 wt. % to 10 wt. silica, e.g., 75 wt. % to 85 wt. % alumina and 25 wt. % to 15 wt. % of silica, e.g., 88 wt. alumina and 12 wt. % silica, e.g., 65 wt. % to 75 wt. % alumina and 35 wt. % to 25 wt. silica, e.g., 70 wt. % alumina and 30 wt. % silica, e.g., 60 wt. % to less than 75 wt. alumina and greater than 25 wt. % to 40 wt. % silica. In accordance with further non-limiting embodiments, the inorganic protective coating includes 40 wt. % to 15 wt. alumina and 60 wt. % to 85 wt. % silica such as 85 wt. % silica and 15 wt. % alumina. Other materials, such as aluminum, chromium, hafnium, yttrium, nickel, boron, phosphorous, titanium, zirconium, and/or oxides thereof, can also be present, for purposes including adjustment of the refractive index of the inorganic protective coating. With some embodiments, the refractive index of the inorganic protective coating can be in the range of 1 to 3, such as 1 to 2, such as 1.4 to 2, such as 1.4 to 1.8.

In accordance with some embodiments, the inorganic protective coating (e.g., 26) includes a combination of silica and alumina. The inorganic protective coating can be sputtered from two cathodes (e.g., one silicon and one aluminum) or from a single cathode containing both silicon and aluminum. This silicon/aluminum oxide inorganic protective coating can be represented by the following formula, $Si_xAl_{1-x}O_{1.5+x/2}$, where x can vary from greater than 0 to less than 1. With further non-limiting embodiments, the inorganic protective coating can be a silicon/aluminum oxide coating ($Si_xAl_{1-x}O_{(1.2+x2)}$) having a thickness in the range of 5 nm to 5,000 nm, such as 5 nm to 1,000 nm, such as 10 nm to 100 nm, e.g., 10 nm to 50 nm, such as 10 nm to 40 nm, such as 20 nm to 30 nm, such as 25 nm. Further, the protective coating 50 can be of non-uniform thickness. By "non-uniform thickness" is meant that the thickness of the inorganic protective coating can vary over a given unit area (e.g., the inorganic protective coating can have high and low spots or areas).

In further non-limiting embodiments, the inorganic protective coating (e.g., 26) includes a silicon/aluminum oxide coating or mixture of silica and alumina, such as 85 wt. % silica and 15 wt. % alumina, and has a thickness in the range of 10 nm to 500 nm, such as 20 nm to 300 nm, such as 50 nm to 300 nm, e.g., 50 nm to 200 nm, such as 50 nm to 150 nm, such as 50 nm to 120 nm, such as 75 nm to 120 nm such as 75 nm to 100 nm. In accordance with further non-limiting embodiments, the inorganic protective coating can have a thickness of at least 50 nm, such as at least 75 nm, such as at least 100 nm, such as at least 110 nm, such as at least 120 nm, such as at least 150 nm, such as at least 200 nm.

With further non-limiting embodiments, the inorganic protective coating (e.g., 26) includes silica having a thickness in the range of 10 nm to 100 nm, such as 10 nm to 80 nm, such as 20 nm to 80 nm, such as 30 nm to 70 nm, such as 40 nm to 60 nm, such as 50 nm. In accordance with additional non-limiting embodiments, the inorganic protective coating 50 includes silica having a thickness in the range of 10 nm to 500 nm, such as 10 nm to 400 nm, such as 20 nm to 300 nm, such as 50 nm to 200 nm, such as 75 nm to 150 nm, such as 75 nm to 120 nm.

In accordance with still further non-limiting embodiments, the inorganic protective coating (e.g., 26) can include a multi-layer structure, such as a first layer with at least one second layer formed over the first layer. With some embodiments, the first layer can include alumina, or a mixture or alloy that includes alumina and silica. For example, the first layer can include a silica/alumina mixture having greater than 5 wt. alumina, such as greater than 10 wt. % alumina, such as greater than 15 wt. % alumina, such as greater than 30 wt. % alumina, such as greater than 40 wt. % alumina, such as 50 wt. % to 70 wt. % alumina, such as in the range of 70 wt. % to 100 wt. % alumina and 30 wt. % to 0 wt. % silica, such as greater than 90 wt. % alumina, such as greater than 95 wt. % alumina. In accordance with some embodiments, the first layer includes all or substantially all alumina. In accordance with other embodiments, the first layer can have a thickness in the range of greater than 0 nm to 1 micron, such as 5 nm to 10 nm, such as 10 nm to 25 nm, such as 10 nm to 15 nm. The second layer can include silica or a mixture or alloy that includes silica and alumina. For example, the second layer can include a silica/alumina mixture having greater than 40 wt. % silica, such as greater than 50 wt. % silica, such as greater than 60 wt. % silica, such as greater than 70 wt. % silica, such as greater than 80 wt. % silica, such as in the range of 80 wt. % to 90 wt. % silica and 10 wt. % to 20 wt. % alumina, e.g., 85 wt. % silica and 15 wt. % alumina. With other non-limiting embodiments, the second layer can have a thickness in the range of greater than 0 nm to 2 microns, such as 5 nm to 500 nm, such as 5 nm to 200 nm, such as 10 nm to 100 nm, such as 30 nm to 50 nm, such as 35 nm to 40 nm. In further embodiments, the second layer can have a thickness in the range of greater than 0 nm to 1 micron, such as 5 nm to 10 nm, such as 10 nm to 25 nm, such as 10 nm to 15 nm.

In additional non-limiting embodiments, the inorganic protective coating (e.g., 26) can be a bilayer formed by one metal oxide-containing layer (e.g., a silica and/or alumina-containing first layer) formed over another metal oxide-containing layer (e.g., a silica and/or alumina-containing second layer). The individual layers of the multi-layer inorganic protective coating can be of any desired thickness. Non-limiting examples of suitable inorganic protective coatings are described, for example, in U.S. Pat. Nos. 6,869,644 B2, 7,311,961 B2, 6,916,542 B2, and 6,962,759 B2, and U.S. Patent Application Publication No.'s 2002/0172775 A1 and 2003/0228476 A1.

In accordance with some embodiments, the inorganic protective coating can include an oxide, nitride, or oxynitride of silicon, and optionally at least one other element, such as aluminum, and mixtures, alloys, or combinations of two or more thereof. The inorganic protective coating can, with some embodiments, include a material selected from silica, alumina, or a mixture of silica and alumina. With some further embodiments, the inorganic protective coating can have a thickness of from 75 nm to 120 nm.

The reflective article of the present invention can optionally include one or more further films or layers. Examples of additional films or layers that can be present include, but are not limited to, a top coat, a corrosion resistant or anti-corrosion coating, a primer layer, an encapsulation structure, and/or a photoactive coating, each of which will be described in further detail herein. Each of these additional films or layers can include a single layer or multiple films or layers.

With some embodiments, the reflective article of the present invention further includes a top coat positioned between the primary reflective coating and the inorganic protective coating. The top coat, with some embodiments, can include at least one layer that includes a material selected from zinc oxide, tin oxide, or zinc stannate. With some additional embodiments, the top coat can have a thickness of from 100 nm to 200 nm.

With some further embodiments, the reflective article of the present invention further includes an anti-corrosion coating positioned between the primary reflective coating and the inorganic protective coating. The anti-corrosion coating, with some embodiments, can include at least one metal or metal alloy selected from members of Groups 2-16 of the Periodic Table of the Elements (e.g., a nickel alloy). With some additional embodiments, the anti-corrosion coating can have a thickness of from 20 nm to 40 nm.

Figure 3:
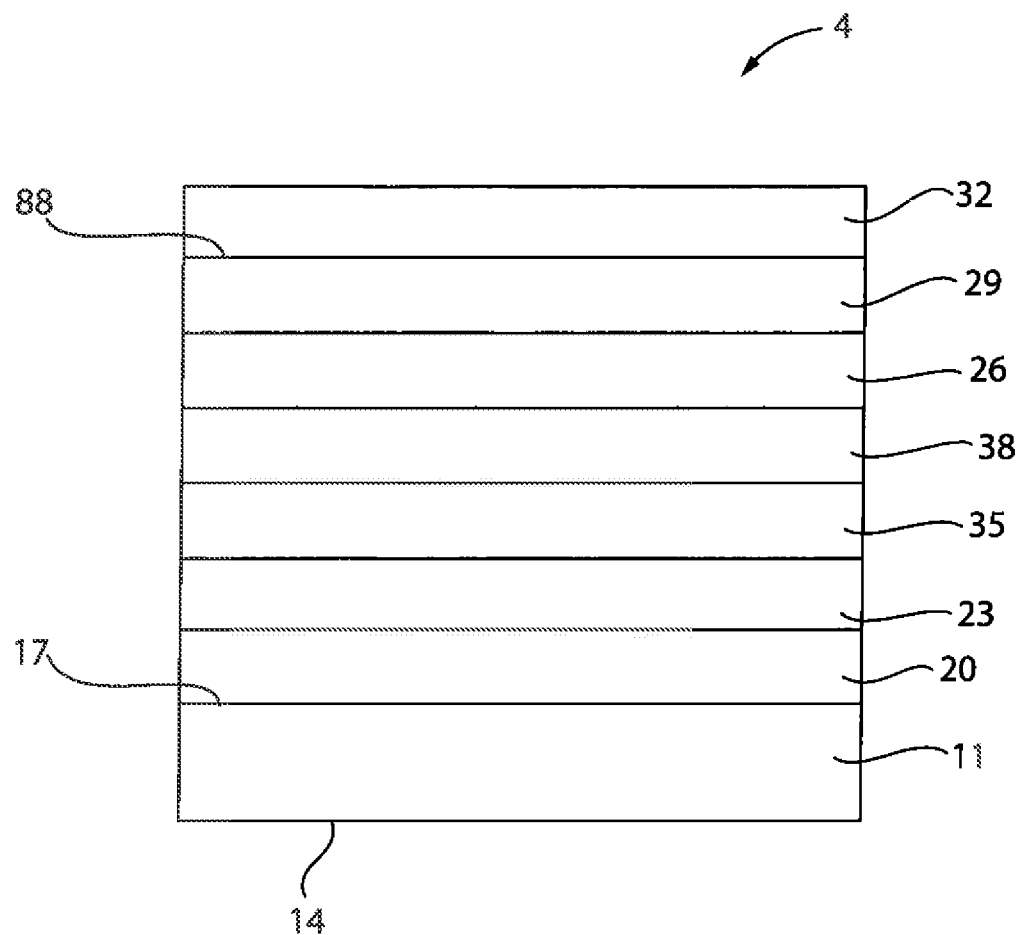
FIG. 3 is a representative sectional view of a further reflective article according to the present invention.

The reflective article of the present invention can, with some embodiments, additionally include both an anti-corrosion coating and a top coat. With reference to FIG. 3, reflective article 4 includes, a transparent substrate 11 having a first major surface 14 and a second major surface 17. A basecoat 20 is formed and resides over at least a portion of the second major surface 17 of the transparent substrate 11. A primary reflective coating 23 is formed and resides over at least a portion of the basecoat 20. An anti-corrosion coating 35 is formed and resides over at least a portion of the primary reflective coating 23. The anti-corrosion coating 35, can with some embodiments, include a nickel alloy, and can have a thickness of from 20 nm to 40 nm. A top coat 38 is formed and resides over at least a portion of the anti-corrosion coating 35. The top coat 38 includes, with some embodiments, at least one layer that includes a material selected from zinc oxide, tin oxide, or zinc stannate, and can have a thickness of 100 nm to 200 nm. An inorganic protective coating 26 is formed and resides over at least a portion of top coat 38. A sacrificial cathodic layer 29 is formed and resides over at least a portion of inorganic protective coating 26. The sacrificial cathodic layer 29 includes, with some embodiments, at least one transition metal, and is free of lead. The transition metal of the sacrificial cathodic layer 29 is a particulate transition metal. An outer organic polymer coating 32 is formed and resides over sacrificial cathodic layer 29. The outer organic polymer coating 32 is free of lead. The transparent substrate 11, basecoat 20, primary reflective coating 23, inorganic protective coating 26, sacrificial cathodic layer 29, and outer organic polymer coating 32 of reflective article 4 are each as described previously herein. The anti-corrosion coating and top coat will be described in further detail as follows.

The anti-corrosion coating (e.g., 35 of FIG. 3) can provide various benefits, such as corrosion inhibition and ultraviolet screening benefits. Also, the anti-corrosion coating can provide some amount of electromagnetic energy reflection, which can permit a thinner primary reflective layer (e.g., 23) to be used. The anti-corrosion coating can also provide mechanical and/or chemical protection to the underlying coating layers. The anti-corrosion coating can be provided under, over, or between one or more coating layers, e.g., the primary reflective coating(s) (e.g., 23) or the top coat (e.g., 38) (described in further detail below). Alternatively or in addition thereto, the anti-corrosion coating can be provided under, over, or between one or more layers of the inorganic protective coating (e.g., 26). It is believed that the anti-corrosion coating increases the corrosion resistance of the underlying coatings, and/or enhances the visible light reflective of the reflective article (e.g., 4), and/or blocks or reduces the passage of UV radiation.

Examples of suitable materials for the anti-corrosion coating include, but are not limited to, elemental metals and alloys of two or more metallic elements which are members of Groups 2-16 of the Periodic Table of the Elements, including, but not limited to, nickel and nickel-containing alloys, ferrous alloys and iron-containing alloys such as stainless steels, aluminum and aluminum-containing alloys, copper and copper-containing alloys, chromium and chromium-containing alloys, titanium and titanium-containing alloys, brasses such as Naval brass (an alloy of Cu, Zn and Sn), Admiralty brass (an alloy of Zn, Sn and Cu), and Aluminum brass (an alloy of Cu, Zn and Al), cobalt and cobalt-containing alloys such as alloys of cobalt and chromium, zinc and zinc-containing alloys, tin and tin-containing alloys, zirconium and zirconium-containing alloys, molybdenum and molybdenum-containing alloys, tungsten and tungsten-containing alloys, niobium and niobium-containing alloys, indium and indium-containing alloys, lead and lead-containing alloys, and bismuth and bismuth-containing alloys. Specific non-limiting embodiments include corrosion-resistant metals and metal alloys including, but not limited to, nickel and nickel-containing alloys such as Nickel 200, Inconel® alloys such as Inconel 600 and Inconel 625, stainless steels such as stainless steel 304 and stainless steel 316, Monel® alloys such as Monel 400, Hastelloy® alloys, cobalt and cobalt-containing alloys such as Stellite® alloys, Inco alloys such as Inco Alloy C-276 and Inco Alloy 020, Incoloy® alloys such as Incoloy 800 and Incoloy 825, copper and copper-containing alloys such as brasses especially Naval Brass (approximately 59% copper, 40% zinc, and 1% tin) and Admiralty Brass (approximately 69% copper, 30% zinc, 1% tin), silicon and silicon-containing alloys, titanium and titanium-containing alloys, and aluminum and aluminum-containing alloys such as aluminum 6061.

If present, the anti-corrosion coating(s) can have any desired thickness. In some non-limiting embodiments, the anti-corrosion coating(s) can have thicknesses in the range of, but not limited to, 1 nm to 500 nm, such as 1 nm to 400 nm, such as 1 nm to 300 nm, such as 1 nm to 200 nm, such as 1 nm to 100 nm, such as 10 nm to 100 nm, such as 20 nm to 100 nm, such as 30 nm to 100 nm, such as 40 nm to 100 nm, such as 50 nm to 100 nm, such as 20 nm to 40 nm, such as 30 nm to 40 nm, such as 30 nm to 35 nm. In other non-limiting embodiments, the anti-corrosion coating(s) 104 can have a thickness of at least 10 nm, such as at least 20 nm, such as at least 30 nm, such as at least 40 nm, such as at least 50 nm, such as at least 100 nm, such as at least 200 nm. With some embodiments, the anti-corrosion coating(s) include Inconel and can have a thickness in the range of 10 nm to 100 nm, such as 10 nm to 80 nm, such as 15 nm to 50 nm, such as 20 nm to 40 nm, such as 30 nm to 40 nm, such as 30 nm to 35 nm.

While not depicted in the drawing figures, the reflective articles of the present invention can optionally further include one or more primer layers. The optional primer layer can be formed above and/or below the anti-corrosion coating(s) (e.g., 35), such as abuttingly above and/or abuttingly below each anti-corrosion coating. The primer layer typically serves one or both of the following functions: (a) a chemical trap (or getter) for oxygen or other chemical species (either endogenous or exogenous to the reflective article) such that the chemical species react with the primer layer(s) rather than the primary reflective coating (e.g., 23); and/or (b) a physical diffusion barrier to prevent chemical species from reaching and affecting (not necessarily by chemical reaction) the primary reflective coating. With some embodiments, the optional primer layer(s) can include a metal or metal alloy which has a strong affinity for oxygen and/or the chemical reaction product of the metal or metal alloy with oxygen. The optional primer layer(s) can also include materials which constitute (or establish) a diffusion barrier so as to prevent the diffusion of molecular or atomic oxygen, water vapor, or other gaseous species from chemically reacting with the primary reflective coating (e.g., 23). With some further embodiments, the primer layer includes titanium, titanium oxide, or a mixture/combination thereof. With still further embodiments, the primer layer can have a thickness in the range of 0.1 to 10 nm, such as 0.5 to 5 nm, such as 0.5 to 4 nm, such as 0.5 to 2 nm, such as 1 nm to 2 nm.

The top coat (e.g., 38) is formed and resides over at least a portion of the primary reflective coating (e.g., 23). With some embodiments, the top coat is formed and resides over at least a portion of the anti-corrosion layer (e.g., 35). With some further embodiments, the top coat is formed and resides over at least a portion of the primer layer (not shown in the drawings), which is accordingly interposed between the top coat and the anti-corrosion layer.

The top coat can include one or more layers (e.g., one or more dielectric layers) such as one or more metal oxides, nitrides, oxynitrides, borides, fluorides, or carbides. In some embodiments, the top coat can be a single layer that includes a zinc and tin oxide, such as zinc stannate. In other embodiments, the top coat can include a multi-film structure, as described in further detail below. It is to be understood, however, that the invention is not limited to oxide coatings. With further embodiments, the top coat includes zinc stannate. The top coat can have a thickness of at least 10 nm, such as at least 20 nm, such as at least 50 nm, such as at least 75 nm, such as at least 100 nm, such as at least 150 nm, such as at least 200 nm. With some embodiments, the top coat can have a thickness in the range of 5 nm to 500 nm, such as 10 nm to 500 nm, such as 50 nm to 500 nm, e.g., 50 nm to 300 nm, such as 100 nm to 250 nm, such as 100 nm to 200 nm, such as 120 nm to 165 nm, such as 110 nm to 165 nm. Typically, the thicker the top coat, the more protection it provides to the underlying coating layers.

As discussed previously herein, the top coat (e.g., 38) can include one or more layers (e.g., one or more dielectric layers) such as one or more metal oxides, nitrides, oxynitrides, borides, fluorides, or carbides. With some embodiments, the top coat includes a multi-film (or multi-layered) structure (not shown in the drawings) having a first film (e.g., a metal oxide film), a second film (e.g., a metal alloy oxide or oxide mixture film), and optionally a third film (e.g., a metal oxide film). When the third film is present, the second film is typically interposed between the first film and the third film. It is to be understood, however, that the invention is not limited to oxide coatings and that other coatings, such as but not limited to nitrides or oxynitrides, can be used. With some embodiments, the topcoat can include zinc oxide or a zinc/tin oxide, such as zinc stannate, and can have a thickness in the range of 1 nm to 500 nm, such as 5 nm to 500 nm, such as 10 nm to 500 nm, such as 50 nm to 500 nm, e.g., 50 nm to 300 nm, such as 100 nm to 250 nm, such as 100 nm to 200 nm, such as 120 nm to 165 nm.

With some embodiments, the first film, of the multi-layered (or multi-filmed) top coat, can be a zinc-containing film, such as zinc oxide. The zinc oxide film can be deposited from a zinc cathode that includes other materials to improve the conductivity and sputtering characteristics of the cathode. For example, the zinc cathode can include a small amount (e.g., 10 wt. % or less, such as 0 wt. % to 5 wt. %) of a conductive material, such as tin, to improve the sputtering characteristics of the cathode. In which case, the resultant zinc oxide film would include a small percentage of tin oxide, e.g., 0 to 10 wt. % tin oxide, e.g., 0 to 5 wt. % tin oxide. A coating layer deposited from a zinc cathode having 10 wt. % or less tin is referred to herein as "a zinc oxide" layer even though a small amount of the tin (e.g. 10 wt. %) may be present. The small amount of tin in the cathode is believed to form a small amount of tin oxide in the predominantly zinc oxide-containing film. With some embodiments, the zinc oxide first film, of the multi-layered top coat, includes 90 wt. % zinc and 10 wt. % tin and has a thickness in the range of 1 nm to 200 nm, such as 1 nm to 150 nm, such as 1 nm to 100 nm, such as 1 nm to 50 nm, such as 1 nm to 25 nm, such as 1 nm to 20 nm, such as 1 nm to 10 nm, such as 2 nm to 8 nm, such as 3 nm to 8 nm, such as 4 nm to 7 nm, such as 5 nm to 7 nm, such as 6 nm.

The second film, of the multi-layered top coat, can, with some embodiments, be a zinc/tin alloy oxide or zinc/tin oxide mixture film. The zinc/tin alloy oxide can be that obtained from magnetron sputtering vacuum deposition from a cathode of zinc and tin that can comprise zinc and tin in proportions of 10 wt. % to 90 wt. % zinc and 90 wt. % to 10 wt. % tin. Suitable metal alloy oxides that can be present in the second film include, but are not limited to, zinc stannate. By "zinc stannate" is meant a composition of $Zn_xSn_{1-x}O_{2-x}$ (Formula I) where "x" varies in the range of greater than 0 to less than 1. For instance, "x" can be greater than 0 and can be any fraction or decimal between greater than 0 to less than 1. For example, where x=2/3, Formula I is $Zn_{2/3}Sn_{1/3}O_{4/3}$, which is more commonly described as "$Zn_2SnO_4$". A zinc stannate-containing film has one or more of the forms of Formula I in a predominant amount in the film. With some embodiments, a zinc stannate second film can have a thickness in the range of 1 nm to 200 nm, such as 1 nm to 150 nm, such as 1 nm to 100 nm, such as 1 nm to 50 nm, such as 1 nm to 25 nm, such as 1 nm to 20 nm, such as 5 nm to 15 nm, such as 6 nm to 14 nm, such as 8 nm to 14 nm, such as 10 nm to 14 nm, such as 11 nm to 13 nm, such as 12 nm.

In accordance with some embodiments, the optional third film, of the multi-layered top coat, can be a zinc containing film similar to the first film (e.g., a zinc oxide film). With some further embodiments, the optional zinc oxide third film has a thickness in the range of 1 nm to 200 nm, such as 1 nm to 150 nm, such as 1 nm 100 nm, such as 1 nm to 50 nm, such as 1 nm to 25 nm, such as 1 nm to 10 nm, such as in the range of 2 nm to 8 nm, such as in the range of 3 nm to 8 nm, such as in the range of 4 nm to 7 nm, such as in-the range of 5 nm to 7 nm, such as 6 nm.

Figure 2:
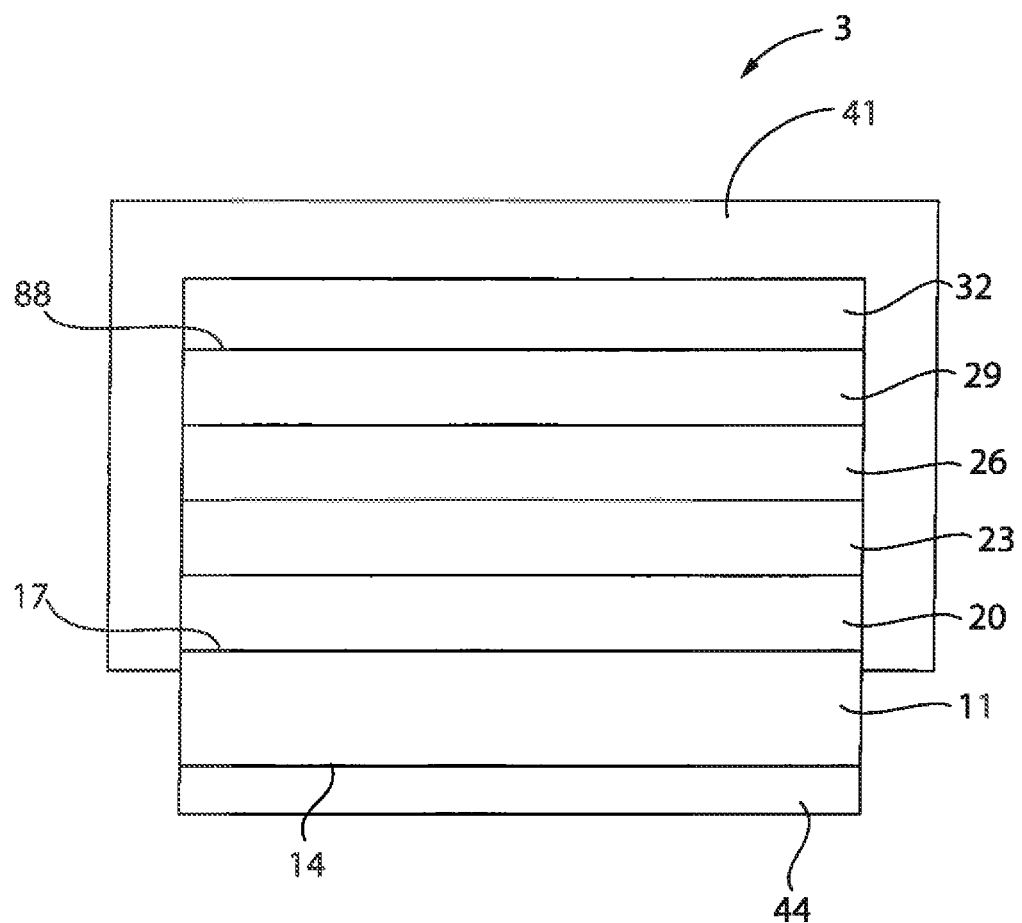
FIG. 2 is a representative sectional view of a reflective article according to the present invention similar to that of FIG. 1, which further includes an optional photoactive layer, and an optional encapsulating structure.

The reflective article of the present invention can include an optional encapsulation structure. The encapsulation structure typically resides over at least a portion of the outer organic polymer coating (e.g., 32). With reference to FIG. 2, reflective article 3, in addition to transparent substrate 11 and the layers described with regard to reflective article 2 of FIG. 1, further includes an encapsulation structure 41, which is provided over at least a portion of outer organic polymer coating 32. As depicted in FIG. 2, encapsulation structure 41 also covers at least a portion of the exposed side portions of the coating layers interposed between reflective substrate 11 and outer organic polymer coating 32, including outer organic polymer coating 32. In addition, encapsulation structure 41 can also cover at least a portion of the exposed side portions of transparent substrate 11, as depicted in FIG. 2.

The optional encapsulation structure (e.g., 41) can be formed over and/or around at least a portion of the coated transparent substrate (e.g., 11) as described above. With some embodiments, the encapsulation structure is formed at least partly by (or includes) an encapsulating material.

Suitable encapsulating materials include, for example, polymeric materials, inorganic materials, or composites, combinations, blends, mixtures, and alloys thereof. When a substantial portion or all of the encapsulation material includes a polymeric material, the encapsulation material can be deposited by any conventional methods, such as but not limited to, brush coating, roll coating, spray coating, curtain coating, dip coating, spin coating, knife-edge coating, screen printing, flood coating, electrocoating (also referred to as, electrodeposition), and powder coating. Suitable polymeric encapsulating materials include, but are not limited to, thermoplastics, thermosets, elastomers, and thermoplastic elastomers formed by addition polymerization or condensation polymerization, with or without cross-linking, and copolymers, composites, combinations, mixtures, blends, and alloys thereof. Encapsulants including polymeric materials, however, can optionally include various additives and fillers including, but not limited to, initiators, photoinitiators, plasticizers, stabilizers, preservatives, biocides, flattening agents, flow agents, antioxidants, ultraviolet (UV) absorbers, surfactants, dyes, pigments, and inorganic or organic fillers.

Examples of polymeric encapsulation materials include, but are not limited to, polyacrylates, polyalkyds, polyacrylnitriles, polyesters, polyfluorocarbons, polyvinyls, polyureas, polymelamines, and polycarbonates. For example, the encapsulation structure (e.g., 41) can include acrylic-based coatings, urethane-based coatings, fluoropolymer and/or chlorofluoropolymer coatings (e.g., polyfluoroethylene, polychlorotrifluoroethylene, etc), polyvinylidene chloride-based coatings, ethylene vinyl alcohol-based coatings, polyacrylonitrile-based coatings, cyclic olefin polymers or copolymer-based coatings, inorganic/organic composite coatings: organic polymer matrix with one or more inorganic phases (e.g., ceramics like silicon dioxide and aluminum oxide) dispersed within either uniformly or non-uniformly, plasma-sprayed inorganic coatings: ceramics (e.g., silicon dioxide, aluminum oxide, silicon nitride, titanium boride, titanium carbide, boron nitride, silicon carbide) and metals/metal alloys (e.g., aluminum, titanium, nickel-based alloys like Inconel, ferrous alloys like stainless steel), vulcanized butadiene-based coatings (e.g., synthetic rubber with sulfur crosslinking), UV-curable polysiloxane coatings, laminates comprising polymer interlayers (e.g., ethylene vinyl acetate or polyvinylidene chloride interlayers) and glass back plates. With some embodiments, the polymeric material is free of heavy metals, such as lead.

For encapsulants that include all inorganic materials, suitable materials include, but are not limited to, metals, metal alloys, or ceramics and composites or combinations thereof. Examples of suitable processes to deposit such inorganic encapsulants include physical vapor deposition (e.g., sputter deposition, electron beam evaporation, thermal evaporation, cathodic arc deposition, plasma spray deposition, flame spray deposition, pyrolytic spray deposition, ion-assisted deposition), chemical vapor deposition (e.g., thermal CVD, plasma-assisted/plasma-enhanced CVD), sol-gel deposition, other wet-chemical processes (e.g., ceramic enamels), and combinations thereof. Further, the encapsulating structure (e.g., 41) can include both polymeric and inorganic materials in combination.

More particular examples of coatings that are suitable for the encapsulation structure (e.g., 41) include, but are not limited to, the Corabond® family of coatings (such as Corabond® HC7707 coating) commercially available from PPG Industries, Inc. of Pittsburgh, Pa., Ferro GAL-1875 "Etch" ceramic enamel, Cosmichrome® coating (commercially available from Gold Touch, Inc.), Sureguard® mirror backing coating (commercially available from Spraylat Corporation), EcoBrite® ink coatings (commercially available from PPG Industries, Inc), PRC 4429 and PRC 4400 coatings commercially available from PRC DeSoto, and Spraylat Lacryl Series 700 or 800 coatings (available from Spraylat Corporation).

Alternatively, the encapsulating structure (e.g., 41) can be metallic, such as formed by one or more metallic layers, such as those described above with respect to the anti-corrosion coating (e.g., 35), with an optional polymeric material formed over the metallic layer(s). Additional non-limiting examples of non-polymeric/inorganic encapsulants include ceramic enamels, sol-gel ceramic coatings, flame-sprayed ceramic or metallic coatings, plasma-sprayed ceramic or metallic coatings, and cathodic arc-sprayed ceramic or metallic coatings. With some embodiments, the encapsulation structure can be a multi-layer structure, such as a bilayer coating having a low lead-containing or lead-free basecoat and a low lead-containing or lead-free topcoat.

Figure 4:
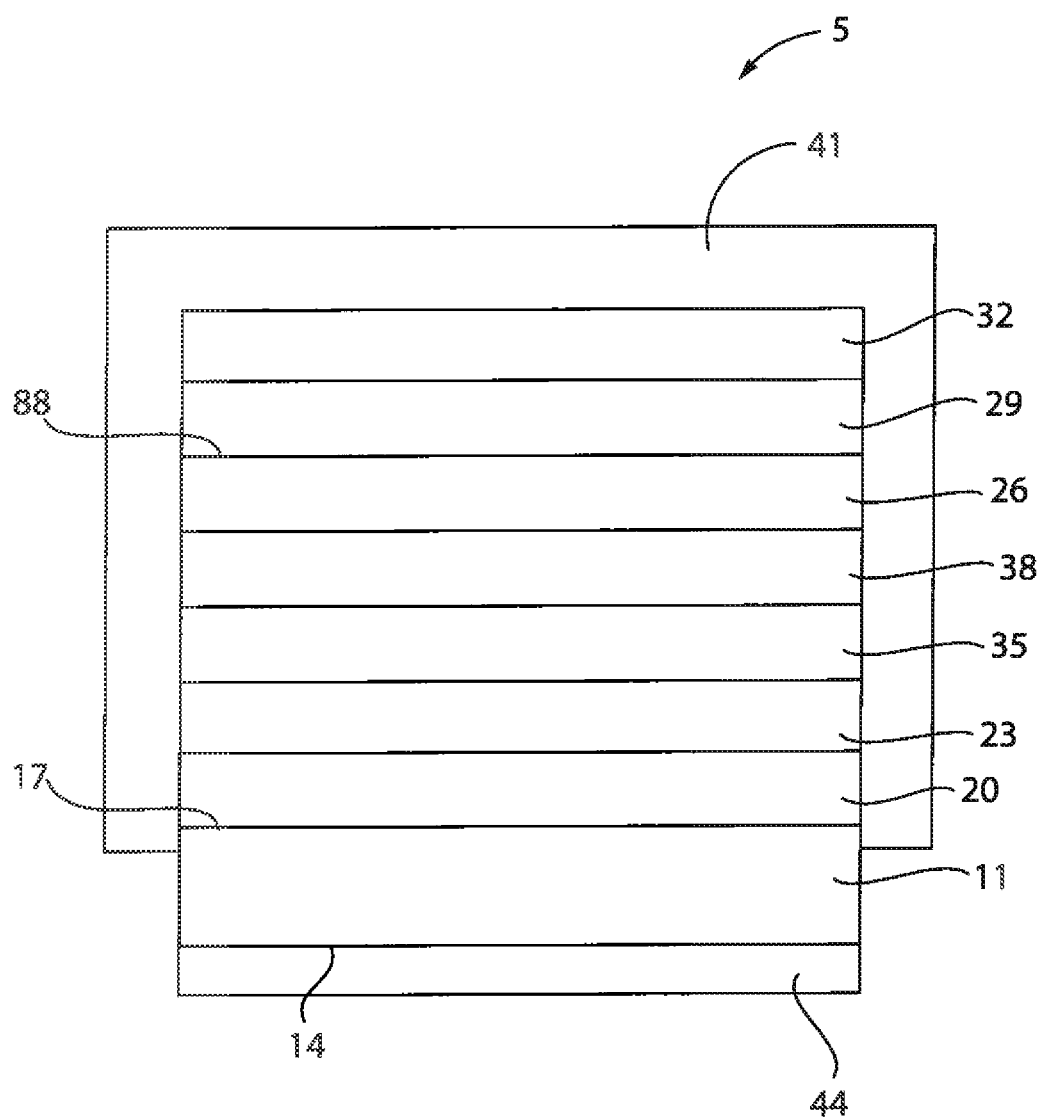
FIG. 4 is a representative sectional view of a reflective article according to the present invention similar to that of FIG. 3, which further includes an optional photoactive layer, and an optional encapsulating structure.

With reference to FIG. 4, reflective article 5, in addition to transparent substrate 11 and the layers described with regard to reflective article 4 of FIG. 3, further includes an encapsulation structure 41, which is provided over at least a portion of outer organic polymer coating 32.

The reflective articles of the present invention can optionally further include a photoactive coating, such as a photocatalytic and/or photohydrophilic coating. The photoactive coating is typically formed and resides over the first major surface (e.g., 14) of the transparent substrate (e.g., 11). With reference to FIG. 2, reflective article 3 includes a photoactive coating 44 formed over first major surface 14 of transparent substrate 11. With reference to FIG. 4, reflective article 5 includes a photoactive coating 44 formed over first major surface 14 of transparent substrate 11. A non-limiting example of a suitable material for the photoactive coating is titania. The photoactive coating can be deposited directly on the first surface (e.g., 14), or a barrier layer, such as a sodium ion diffusion barrier (SIDB) layer (not shown in the drawings) can be provided between the first surface 14 and the photoactive coating 44. A non-limiting example of a suitable SIDB layer material is silica or alumina or combinations thereof. Alternatively, the photoactive coating 44 can be eliminated and just the SIDB layer formed over the first surface 14.

The reflective articles of the present invention can optionally further include a secondary reflective coating (not shown in the drawings). The secondary reflective coating can be formed and reside over the primary reflective coating. With some embodiments, the secondary reflective coating is formed and is interposed between the transparent substrate (e.g., 11) and the primary reflective coating (e.g., 23). Typically, one or more coating layers are interposed between the secondary reflective coating and the primary reflective coating, such as an optional adhesive layer (not shown in the drawings).

The optional secondary reflective coating, if present, can provide one or more functions in the reflective article of the present invention. With some embodiments, the secondary reflective coating can be selected so as to enhance the overall electromagnetic radiation reflection of the reflective article in a particular area or range of electromagnetic radiation. The secondary reflective coating can be selected or designed so as to enhance the reflection of electromagnetic radiation in one or more portions of the electromagnetic spectrum (e.g., visible, infrared, and/or ultraviolet). With some embodiments, the secondary reflective coating can be selected so as to enhance the reflection of short wavelength radiation, such as less than 600 nm, such as less than 550 nm, such as in the range of 400 nm to 550 nm. Alternatively, the secondary reflective coating can be adjusted (or tuned, or attenuated), such as by varying its thickness, so as to reflect UV radiation. The secondary reflective coating can include one or more layers of reflective material, such as one or more layers of metal oxide materials. With some embodiments, the secondary reflective coating includes alternating layers of a relatively high refractive index material and a relatively low refractive index material. A "high" refractive index material is any material having an index of refraction higher than that of the "low" refractive index material. With some embodiments, a low refractive index material is a material having an index of refraction of less than or equal to 1.75. Non-limiting examples of low refractive index materials include silica, alumina, fluorides (such as magnesium fluoride and calcium fluoride) and alloys, mixtures or combinations thereof. With some embodiments, a high refractive index material has an index of refraction greater than 1.75. Non-limiting examples of such materials include titania, zirconia, zinc stannate, silicon nitride, zinc oxide, tin doped zinc oxide, niobium oxide, tantalum oxide, and alloys, mixtures and combinations thereof. The secondary reflective coating can be, for example but not limiting to the present invention, a multi-layer secondary reflective coating having a first layer (e.g., a first dielectric layer), and a second layer (e.g., a second dielectric layer). With some embodiments, the first layer has a high refractive index, and the second layer has a low refractive index. With some embodiments, the first layer includes titania, and the second layer includes silica. With some further embodiments, the first layer (e.g., titania) has a thickness in the range of 15 nm to 35 nm, such as 20 nm to 30 nm, such as 22 nm to 27 nm, such as 25 nm. The second layer (e.g., silica) can have a thickness in the range of 30 nm to 60 nm, such as 35 nm to 50 nm, such as 40 nm to 50 nm, such as 42 nm. It is to be understood that the materials of the secondary reflective coating are not limited to metal oxides. Any materials, such as but not limited to oxides, nitrides, oxynitrides, fluorides, etc. can be utilized.

As discussed above, an optional adhesive layer can be interposed between the primary reflective coating and the secondary reflective coating. The adhesive layer (not shown in the drawings) can be any layer that enhances the adhesion between the secondary and primary reflective coatings, or improves the mechanical and/or chemical durability of the secondary and/or primary reflective coatings. The optional adhesive layer can include at least one material selected from dielectrics, semiconductors, polymers, organics, or layers of metal or metal alloys. With some embodiments, the adhesive layer includes at least one material selected from oxides, nitrides, or oxynitrides of zinc, tin, titanium, or combinations thereof, such as but not limited to zinc oxide, titania, or a zinc/tin oxide such as zinc stannate. For example, the adhesive layer can have a thickness of less than or equal to 5 nm (e.g., from 0.1 nm to 5 nm), such as less than or equal to 4 nm, such as less than or equal to 3 nm, such as less than or equal to 2 nm, such as less than or equal to 1 nm.

Some or all of the coatings described above for the reflective articles of the present invention, such as but not limited to, the basecoat (e.g., 20), the primary reflective coating (e.g., 23), the inorganic protective coating (e.g., 26), the anti-corrosion coating (e.g., 35), the top coat (e.g., 38), the photoactive coating (e.g., 44), the secondary reflective coating, the primer layer, and the adhesive layer, can be deposited by any conventional method, such as but not limited to wet chemical methods (e.g., precipitation of the coating from solution, electroless plating, sol-gel chemistry, etc.), electrochemical methods (e.g., electroplating/electrodeposition), sputter deposition (e.g., magnetron sputter vapor deposition (MSVD)), evaporation (e.g., thermal or electron beam evaporation), chemical vapor deposition (CVD), spray pyrolysis, flame-spraying, or plasma-spraying. With some embodiments, some or all of the coatings can be deposited by MSVD. Examples of MSVD coating devices and methods are well understood by one of ordinary skill in the art and are described, for example, in U.S. Pat. Nos. 4,379,040; 4,861,669; 4,898,789; 4,898,790; 4,900,633; 4,920,006; 4,938,857; 5,328,768; and 5,492,750. For example, the primary reflective coating (e.g., 23) can be applied by wet chemical methods (e.g., "wet-silver" deposition-precipitation of silver from a silver nitrate solution), if desired. With some embodiments, one or more layers of the optional secondary reflective coating can be applied by conventional CVD methods, for example on a float glass ribbon while the ribbon is in the tin bath. The primary reflective coating (e.g., 23) and one or more layers of the top coat (e.g., 38) can then be applied by a different process, such as MSVD. Alternatively, all of the coatings can be applied by the same process, such as by MSVD. While not intending to be bound by any theory, it is believed that applying at least some of the coatings by sputtering has advantages over many other techniques. For example, it is possible to deposit a wide range of materials in a single vacuum chamber. Also, sputter deposition is expected to yield layers having higher chemical purity than conventional wet chemistry methods. Further, sputtering eliminates the liquid waste stream produced-from wet chemical methods and also enables other metals to be easily deposited. Moreover, sputtering allows inorganic oxides to be deposited and to be used for adhesion layers, chemical barriers and mechanical protection.

With some embodiments of the present invention, the reflective article is prepared by wet chemical methods in accordance with art-recognized methods. For example, the second major surface of the substrate, which can be glass, is typically treated with a sensitizer, such as a titanium halide (e.g., titanium chloride). The primary reflective coating is deposited or precipitated onto the treated second major surface, for example from a silver nitrate solution when the primary reflective coating includes silver. The primary reflective coating can include one or more optional further layers, which are deposited or precipitated onto the previously deposited/precipitated reflective layer, such as a copper layer deposited/precipitated from a copper sulfate solution onto a previously deposited/precipitated silver layer. An adhesion promoter or adhesion promoting layer can be applied onto the primary reflective layer prior to application of the sacrificial cathodic layer. The adhesion promoter or adhesion promoting layer can include art-recognized adhesion promoters, such as one or more silanes including, but not limited to, those silanes as described previously herein. The sacrificial cathodic layer and the outer organic polymer coating can next be sequentially applied in accordance with those methods as described previously herein.

The invention provides highly reflective articles that are useful in many applications, such as but not limited to solar mirrors. The reflective articles of the present invention can have a hemispherical solar-weighted, integrated Rg reflectance (WIRg) of at least 50%, such as at least 60%, such as at least 70%, such as at least 80%, such as at least 90%, such as at least 91%, such as at least 92%, such as at least 93%, such as at least 94%, such as at least 95%, such as in the range of 90% to 96%.

The invention will now be described with respect to specific examples illustrating various structures, such as mirror structures, incorporating various aspects of the invention. It is to be understood, however, that the invention is not limited to these specific examples.

EXAMPLES

The present invention is more particularly described in the following examples, which are intended to be illustrative only, since numerous modifications and variations therein will be apparent to those skilled in the art. It is to be understood, however, that the invention is not limited to the following examples. Unless otherwise specified, all parts and all percentages are by weight.

In the following examples and unless otherwise noted, the reflective glass substrates were formed by magnetron sputter vacuum deposition of the following layers over the second major surface of a SOLARPHIRE® PV glass substrate obtained commercially from PPG Industries, Inc. The following layers were formed sequentially on the second major surface: a base coat of titania having a thickness of from 2-5 nanometers; a primary reflective coating of silver having a thickness of about 100 nanometers; an anti-corrosion coating of ICONEL 600 alloy having a thickness of about 30 nanometers; a primer layer of titania having a thickness of about 1 to 2 nanometers; a top coat of zinc stannate having a thickness of about 140 nanometers; and an inorganic protective coating of silica and alumina (85 percent by weight of Si and 15 percent by weight of Al) having a thickness of about 75 nanometers.

Non-sputtered coatings were further applied over the inorganic protective coating of the reflective glass substrates, as described in the following examples. Prior to the application of any non-sputtered coatings over the reflective glass substrates, an adhesion promoter was applied to the inorganic protective coating. The adhesion promoter composition contained SILQUEST A-1100 silane, obtained commercially from Momentive Performance Materials, Inc., in an amount of 5 percent by weight, based on total weight of the adhesion promoter composition, and a mixture of iso-propanol and water in a combined amount of 95 percent by weight, based on total weight of the adhesion promoter composition. The adhesion promoter composition was applied by spray application to the inorganic protective coating of the reflective glass substrate, followed by heating at 150° F. (66° C.) for 1 minute, to remove the solvent.

In the following examples, the coated reflective glass substrates were subjected to CASS (copper chloride fog) testing in accordance with ASTM B368.

Example 1

A reflective article according to the present invention was prepared, in which the sacrificial cathodic layer included an organic polymer matrix. A grind paste for forming a sacrificial cathodic coating composition was prepared using the ingredients and amounts summarized in the following Table A.

TABLE A

| Ingredient | Weight (grams) |
|---|---|
| Polyester Resin[1] | 52.34 |
| Phosphatized Epoxy[2] | 3.98 |
| Melamine[3] | 62.28 |
| Solvent[4] | 185.68 |
| Flow Additive[5] | 2.35 |
| Anti-settling Agent[6] | 20.09 |
| Catalyst[7] | 1.12 |
| Zinc Flake[8] | 381.54 |

[1]The polyester resin was POLYMAC HS 57-5776, from Momentive Specialty Chemicals, which had a solids weight of 85 percent by weight, based on total weight, a hydroxyl number of 178 (based on solids weight), a hydroxyl equivalent weight of 315 (based on solids weight), and an acid number of 10 (based on solids weight).
[2]The phosphatized epoxy was prepared according to U.S. Pat. No. 5,071,904, Example 1, Part B, Footnote 1.
[3]The melamine was RESIMENE R-718, commercially available from INEOS Melamines Inc.
[4]The solvent was composed of 34.2 percent by weight of SOLVESSO 100 (from Exxon Mobil Corporation), 30.8 percent by weight of butyl CELLOSOLVE, and 35.0 percent by weight of butanol, in each case based on total weight of the solvent.
[5]The flow additive was composed of: DIAX 2770 plolymer (18.3% by weight, commercially available from Baker Hughes); COATOSIL 7500 polyalkyleneoxide methyl siloxane (27.7% by weight, commercially available from Momentive Performance Materials, Inc.); and RK-5345 polybutyl acrylate (54.0% by weight, commercially available from E. I. du Pont de Nemours and Company), the percent weights being based in each case on total weight of flow additive.
[6]The anti-settling agent was composed of 61.3 percent by weight of BENTONE SD-2 clay material (commercially available from Elemintis Specialties, Inc.), 30.6 percent AEROSIL 200 fused silica (commercially available from Evonik Industries), and 8.1 percent by weight of BYK 410 rheology additive (commercially available from BYK USA Inc.), the percent weights each being based on total weight.
[7]The catalyst was NACURE 2530 amine neutralized p-toluenesulfonic acid, commercially available from King Industries.
[8]The zinc flake had the trade designation Z45, which is commercially available from Purity Zinc Metals, and had a length to thickness ratio of 20:1.

The ingredients of Table A were mixed using a cowles blade for at least 30 minutes until a Hegman rating of 6.5 (on a scale of 1 to 8) was reached. Solvent (a 1:1 by weight mixture of SOLVESSO 100 and butyl CELLOSOLVE) was mixed with the grind paste so as form a sacrificial cathodic coating composition having a viscosity suitable for spray application.

The sacrificial cathodic coating composition was spray applied, using compressed air, over a reflective glass substrate, and allowed to flash at ambient room temperature to remove solvent. The applied sacrificial cathodic coating had a thickness of 1 mil (25 microns).

A polyester melamine coating composition (free of lead) for use as an outer organic polymer coating was prepared from a grind paste as summarized in the following Table B.

TABLE B

| Ingredient | Weight (grams) |
|---|---|
| Polyester Resin[9] | 104.79 |
| Phosphatized Epoxy[2] | 7.29 |
| Melamine[3] | 31.52 |
| Solvent[4] | 86.01 |
| Flow Additive[5] | 2.16 |
| Catalyst[7] | 1.03 |
| $TiO_2$ | 99.59 |

[9]The polyester resin was obtained commercially from PPG Industries, Inc. under the designation HP 73-5480 SP3, and had a solids weight of 65 percent by weight, based on total weight, a hydroxyl number of 89.2 (based on solids weight), a hydroxyl equivalent weight of 628.9 (based on solids weight), and an acid number of 3.8 (based on solids weight).

The ingredients of Table B were mixed using a cowles blade for at least 30 minutes until a Hegman rating of 6.5 (on a scale of 1 to 8) was reached. Solvent (a 1:1 by weight mixture of SOLVESSO 100 and butyl CELLOSOLVE) was mixed with the grind paste so as form an outer organic polymer coating composition having a viscosity suitable for spray application.

The lead-free outer organic polymer coating prepared from the grind paste of Table B was spray applied, using compressed air, over the previously applied sacrificial cathodic coating. The sacrificial cathodic coating and outer organic polymer coating were together cured at a temperature of 300° F. (149° C.) for 4.2 minutes in an gas oven. The outer organic polymer coating had a thickness of 1 mil (25 microns). The coated reflective glass substrate according to the present invention was cut into test specimens each having a width of 7.6 cm and a length of 10.2 cm.

A control was prepared in accordance with the above described method, but the first polyester melamine coating composition was prepared using the grind paste of Table A in the absence of zinc flakes. The first and second (Table B) polyester melamine coating layers each had a thickness of 1 mil (25 microns). The coated reflective glass substrate control was cut into test specimens each having a width of 7.6 cm and a length of 10.2 cm.

Two test specimens according to the present invention (Example 1) and two control test specimens (Control) were subjected to CASS testing for 120 hours. The test specimens were removed and the coated sides were visually inspected for edge corrosion and face corrosion. Edge corrosion was determined by measuring the distance of corrosion from a cut edge towards the interior of the coated side of the test specimens. Face corrosion was evaluated with regard to whether spots were visually observed on the coated side of the test specimens. The CASS test results are summarized in the following Table 1.

TABLE 1

| Test Specimen | Edge Corrosion | Face Corrosion |
|---|---|---|
| Control | Failed[a] | Spots |
| Example 1 | Passed[b] | No spots observed. |

[a]Failed means edge corrosion of greater than 1.5 mm.
[b]Passed means edge corrosion of less than 1.5 mm.

Example 2

A reflective article according to the present invention was prepared, in which the sacrificial cathodic layer included an inorganic matrix formed from organo-titanate.

An organo-titanate coating composition obtained commercially from PPG Industries, Inc. under the tradename SPINCOAT ZRC coating was spray applied, using compressed air, over a reflective glass substrate, and cured at 400° F. (204° C.) for 30 minutes in an electric oven. The resulting sacrificial cathodic coating had a thickness of 1 mil (25 microns). The organo-titanate coating composition included zinc flake, having a length to thickness ratio of 20:1, in an amount of 90 percent by weight, based on total solids weight of the organo-titanate coating composition.

A polyester melamine coating composition (free of lead), described in Example 1 with regard to Table B, was spray applied, using compressed air, over the sacrificial cathodic coating, to form an outer organic polymer coating, which was cured at 300° F. (149° C.) for 4.2 minutes in an electric oven.

A control was prepared in accordance with the description provided in Example 1.

Two test specimens according to the present invention (Example 2) and two control test specimens (Control) were subjected to CASS testing for 120 hours, and evaluated in accordance with the description provided in Example 1. The test results are summarized in the following Table 2.

TABLE 2

| Test Specimen | Edge Corrosion | Face Corrosion |
|---|---|---|
| Control[c] | Failed[a] | Spots |
| Example 2 | Passed[b] | No spots observed. |

[a]Failed means edge corrosion of greater than 1.5 mm.
[b]Passed means edge corrosion of less than 1.5 mm.
[c]The control was prepared as described in Example 1.

Example 3

A reflective article according to the present invention was prepared, in which the sacrificial cathodic layer included an organic polymer matrix, as described in Example 1, and the outer organic polymer coating was a cationically electrodeposited organic polymer coating that included an acrylic polymer.

A sacrificial cathodic coating composition as described in Example 1 was spray applied, using compressed air, over a reflective glass substrate, and subjected to 240° F. (116° C.) for 2 minutes in an electric oven. The sacrificial cathodic coating had a thickness of 1 mil (25 microns). A cationically electrodeposited organic polymer coating was formed over the sacrificial cathodic coating using an electrodeposition curtain coating process generally in accordance with the description provided previously herein with reference to FIGS. 5-9. POWERCRON 935 cationic acrylic electrodeposition coating composition, commercially available from PPG Industries, Inc., was used in the electrodeposition curtain coating process and to form the outer organic polymer coating. The sacrificial cathodic coating and the cationically electrodeposited outer organic polymer coating were together cured at 350° F. (177° C.) for 30 minutes in an electric oven. The cationically electrodeposited outer organic polymer coating had a thickness of 1 mil (25 microns).

Two test specimens according to the present invention (Example 3) and two control test specimens (Control) were subjected to CASS testing for 120 hours, and evaluated in accordance with the description provided in Example 1. The test results are summarized in the following Table 3.

TABLE 3

| Test Specimen | Edge Corrosion | Face Corrosion |
|---|---|---|
| Control[c] | Failed[a] | Spots |
| Example 3 | Passed[b] | No spots observed. |

[a]Failed means edge corrosion of greater than 1.5 mm.
[b]Passed means edge corrosion of less than 1.5 mm.
[c]The control was prepared as described in Example 1.

Example 4

A reflective article according to the present invention was prepared, in which the sacrificial cathodic layer included an inorganic matrix formed from organo-titanate, as described in Example 2, and the outer organic polymer coating was a cationically electrodeposited organic polymer coating that included an acrylic polymer, as described in Example 3. The sacrificial cathodic coating had a thickness of 1 mil (25 microns) and the outer organic polymer coating had a thickness of 1 mil (25 microns).

A control was prepared by applying POWERCRON 935 cationic acrylic electrodeposition coating composition directly to the reflective glass substrate, in the absence of the sacrificial cathodic layer. The cationic acrylic electrodeposition coating composition was applied using the electrodeposition curtain coating process as described in Example 3. The electrodeposited acrylic coating had a thickness of 1 mil (25 microns).

Two test specimens according to the present invention (Example 4) and two control test specimens (Control) were subjected to CASS testing for 120 hours, and evaluated in accordance with the description provided in Example 1. The test results are summarized in the following Table 4.

TABLE 4

| Test Specimen | Edge Corrosion | Face Corrosion |
|---|---|---|
| Control[d] | Failed[a] | No spots observed. |
| Example 4 | Passed[b] | No spots observed. |

[a]Failed means edge corrosion of greater than 1.5 mm.
[b]Passed means edge corrosion of less than 1.5 mm.
[d]POWERCRON 935 cationic acrylic electrodeposition coating applied directly to the reflective glass substrate.

The results summarized in Examples 1-4 demonstrate that reflective articles according to the present invention that include a sacrificial cathodic layer provide improved corrosion resistance, compared to comparative reflective articles that do not contain such a sacrificial cathodic layer, as determined by CASS testing with regard to edge corrosion and face corrosion.

Example 5

The following test specimens were prepared for purposes of demonstrating that the sacrificial cathodic layer, of the reflective articles of the present invention, acts as a sacrificial layer. The organo-titanate composition containing zinc flakes of Example 2 was formed over half of the inorganic protective coating of a reflective glass substrate in accordance with the description provided in Example 2, and had a thickness of 1 mil (25 microns). No coatings were applied to the uncoated half of the half-coated reflective glass substrate. The half-coated reflective article test specimens are here designated as Example 5a. Using a datalogging multimeter obtained from Extech Instruments, it was determined that electrical continuity existed between (or across) the coated and uncoated halves of the Example 5a test specimens.

Some of the Example 5a test specimens were scribed fully along the junction (or seam) of the coated and uncoated halves thereof, all the way through to the underlying SOLARPHIRE® PV glass substrate. The scribed test specimens are designated herein as Example 5b. Using the datalogging multimeter obtained from Extech Instruments, it was determined that electrical continuity did not exist across the scribe of the Example 5b test specimens (i.e., between or across the coated and uncoated halves of the Example 5b test specimens). In addition, it was determined using the datalogging multimeter, that electrical continuity existed separately on each of the coated and uncoated sides of the Example 5b test specimens (i.e., on either side of the scribe).

The Example 5a and Example 5b test specimens and a control test specimen were subjected to 15 hours of CASS testing, and the results are summarized in the following Table 5.

TABLE 5

| Test Specimen | Edge Corrosion | Face Corrosion |
|---|---|---|
| Control[e] | Failed[a] | Numerous spots observed. |
| Example 5a | No edge corrosion on the coated and uncoated halves. | No spots on the coated and uncoated halves. |
| Example 5b | No edge corrosion on coated half. Edge attack on uncoated half. | No spots on coated half. Numerous spots observed on uncoated half. |

[a]Failed means edge corrosion of greater than 1.5 mm.
[e]Reflective glass substrate alone, with no adhesion treatment.

The results summarized in Table 5 demonstrate that the sacrificial cathodic layer of the reflective articles of the present invention, acts as a sacrificial cathodic layer, as evidenced by the sacrificial cathodic layer providing better corrosion resistance when electrical continuity is present between the coated and uncoated halves of the test specimens (Example 5a), compared to an absence of electrical continuity between the coated and uncoated halves of the test specimens (Example 5b).

It will be readily appreciated by those skilled in the art that modifications can be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A reflective article comprising:
a transparent substrate having a first major surface and a second major surface;
a primary reflective coating formed over at least a portion of said second major surface;
a sacrificial cathodic layer formed over at least a portion of said primary reflective coating, said sacrificial cathodic layer comprising at least one particulate transition metal and an inorganic matrix formed from at least one organo-titanate, and being free of lead; and
an outer organic polymer coating formed over said sacrificial cathodic layer, said outer organic polymer coating being free of lead.

2. The reflective article of claim 1, further comprising, a basecoat formed over at least a portion of said second major surface, and
an inorganic protective coating formed over at least a portion of said primary reflective coating,
wherein said primary reflective coating is formed over at least a portion of said basecoat, and
said sacrificial cathodic layer is formed over at least a portion of said inorganic protective coating.

3. The reflective article of claim 2, wherein the basecoat comprises at least one oxide, nitride, or oxynitride of a metal selected from aluminum, titanium, zirconium, zinc, tin and mixtures, alloys, or combinations thereof.

4. The reflective article of claim 3, wherein the basecoat comprises at least one metal oxide selected from alumina, titania, zirconia, zinc oxide, zinc stannate, tin oxide, and mixtures, alloys, or combinations thereof, and has a thickness of from 1 nm to 3 nm.

5. The reflective article of claim 2, wherein the inorganic protective coating comprises an oxide, nitride, or oxynitride of silicon, and mixtures, alloys, or combinations thereof.

6. The reflective article of claim 5, wherein the inorganic protective coating comprises a material selected from silica, alumina, or a mixture of silica and alumina, and has a thickness of from 75 nm to 120 nm.

7. The reflective article of claim 2, further comprising a top coat positioned between the primary reflective coating and the inorganic protective coating, said top coat comprising at least one layer comprising a material selected from zinc oxide, tin oxide, or zinc stannate.

8. The reflective article of claim 7, wherein said top coat has a thickness of from 100 nm to 200 nm.

9. The reflective article of claim 2, further comprising an anti-corrosion coating positioned between the primary reflective coating and the inorganic protective coating, said anti-corrosion coating comprising at least one metal or metal alloy selected from members of Groups 2-16 of the Periodic Table.

10. The reflective article of claim 9, wherein said anti-corrosion coating has a thickness of from 20 nm to 40 nm.

11. The reflective article of claim 1, wherein said transition metal of said sacrificial cathodic layer is selected from zinc, aluminum, copper, magnesium, and mixtures, alloys, or combinations of two or more thereof.

12. The reflective article of claim 1, wherein said particulate transition metal has a form of flakes.

13. The reflective article of claim 1, wherein said sacrificial cathodic layer is substantially free of an organic polymer matrix.

14. The reflective article of claim 13, wherein said sacrificial cathodic layer and said outer organic polymer coating abut each other, said sacrificial cathodic layer is electrically conductive, and said outer organic polymer coating is a cationically electrodeposited outer organic polymer coating.

15. The reflective article of claim 1, wherein said outer organic polymer coating comprises a polymer selected from polyester polymers, acrylic polymers, polycarbonate polymers, polyether polymers, and combinations thereof.

16. The reflective article of claim 1, wherein the primary reflective coating is opaque to visible light and comprises at least one metallic film, each metallic film independently comprising a metal selected from platinum, iridium, osmium, palladium, aluminum, gold, copper, silver, and mixtures, alloys, or combinations thereof.

17. The reflective article of claim 16, wherein each metallic film independently has a thickness in a range of 50 nm to 200 nm.

18. The reflective article of claim 1, further comprising a photoactive coating formed over at least a portion of said first major surface.

19. A reflective article comprising,
a transparent substrate having a first major surface and a second major surface;
a basecoat formed over at least a portion of the second major surface;
a primary reflective coating formed over at least a portion of the basecoat;
an anti-corrosion coating formed over at least a portion of the primary reflective coating, said anti-corrosion coating comprising a nickel alloy;
a top coat formed over at least a portion of the anti-corrosion coating, said top coat comprising at least one layer comprising a material selected from zinc oxide, tin oxide, or zinc stannate;
an inorganic protective coating formed over at least a portion of said top coat;
a sacrificial cathodic layer formed over at least a portion of said inorganic protective coating, said sacrificial cathodic layer comprising at least one particulate transition metal and an inorganic matrix formed from at least one organo-titanate, and being free of lead; and
an outer organic polymer coating formed over said sacrificial cathodic layer, said outer organic polymer coating being free of lead.

20. The reflective article of claim 19, wherein said anti-corrosion coating has a thickness of from 20 nm to 40 nm, and said top coat has a thickness of from 100 nm to 200 nm.

21. A reflective article comprising:
a transparent substrate having a first major surface and a second major surface;
a basecoat formed over at least a portion of said second major surface;
a primary reflective coating formed over at least a portion of said basecoat;
an inorganic protective coating comprising an oxide, nitride, or oxynitride of silicon, and mixtures, alloys, or combinations thereof formed over at least a portion of said primary reflective coating;
a sacrificial cathodic layer formed over at least a portion of said inorganic protective coating, said sacrificial cathodic layer comprising at least one transition metal, and being free of lead; and
an outer organic polymer coating formed over said sacrificial cathodic layer, said outer organic polymer coating being free of lead.

22. The reflective article of claim 21, wherein the inorganic protective coating comprises a material selected from silica, alumina, or a mixture of silica and alumina, and has a thickness of from 75 nm to 120 nm.

* * * * *